(12) United States Patent
Fukuyoshi et al.

(10) Patent No.: US 7,394,059 B2
(45) Date of Patent: Jul. 1, 2008

(54) NOISE-REDUCING IMAGE SENSOR HAVING LIGHT RECEIVING ELEMENTS

(75) Inventors: Kenzo Fukuyoshi, Tamana (JP); Satoshi Kitamura, Tamana (JP)

(73) Assignee: Toppan Printing Co., Ltd., Tokyo (JP)

( * ) Notice: Subject to any disclaimer, the term of this patent is extended or adjusted under 35 U.S.C. 154(b) by 0 days.

(21) Appl. No.: 11/590,824

(22) Filed: Nov. 1, 2006

(65) Prior Publication Data

US 2007/0045517 A1 Mar. 1, 2007

Related U.S. Application Data

(63) Continuation of application No. PCT/JP05/11275, filed on Jun. 20, 2005.

(30) Foreign Application Priority Data

Jun. 30, 2004 (JP) ............................. 2004-193151

(51) Int. Cl.
*G01J 3/50* (2006.01)
*H04N 3/14* (2006.01)
(52) U.S. Cl. ...................................... 250/226; 348/272
(58) Field of Classification Search ................. 250/226; 348/272–283
See application file for complete search history.

(56) References Cited

U.S. PATENT DOCUMENTS 4,878,113 A * 10/1989 Nakamura .................... 348/71

6,759,646 B1 * 7/2004 Acharya et al. ............. 250/226

FOREIGN PATENT DOCUMENTS

| JP | 6-204444 | 7/1994 |
|---|---|---|
| JP | 6-217079 | 8/1994 |
| JP | 10-65135 | 3/1998 |
| JP | 63-73204 | 4/1998 |
| JP | 2000-19322 | 1/2000 |
| JP | 2000-357785 | 12/2000 |
| JP | 2002-521975 | 7/2002 |
| JP | 2005-184690 | 7/2005 |
| KR | 2003-0044335 | 6/2003 |

OTHER PUBLICATIONS

Korean Office Action and English Translation dated Sep. 14, 2007.

* cited by examiner

*Primary Examiner*—Thanh X Luu
(74) *Attorney, Agent, or Firm*—Kratz, Quintos & Hanson, LLP

(57) ABSTRACT

In an embodiment example of the present invention, an image sensor comprises a filter used for an extraction of a specific color component of an incident light, a light receiving element which observes the incident light via the filter, a compensating filter having a transmission restraining characteristic in a visible light wavelength range and a transmission characteristic in a wavelength range on a longer wavelength out of the visible light wavelength range, and a compensating light receiving element which observes the incident light via the compensating filter for compensating an observation result by the light receiving element.

5 Claims, 19 Drawing Sheets

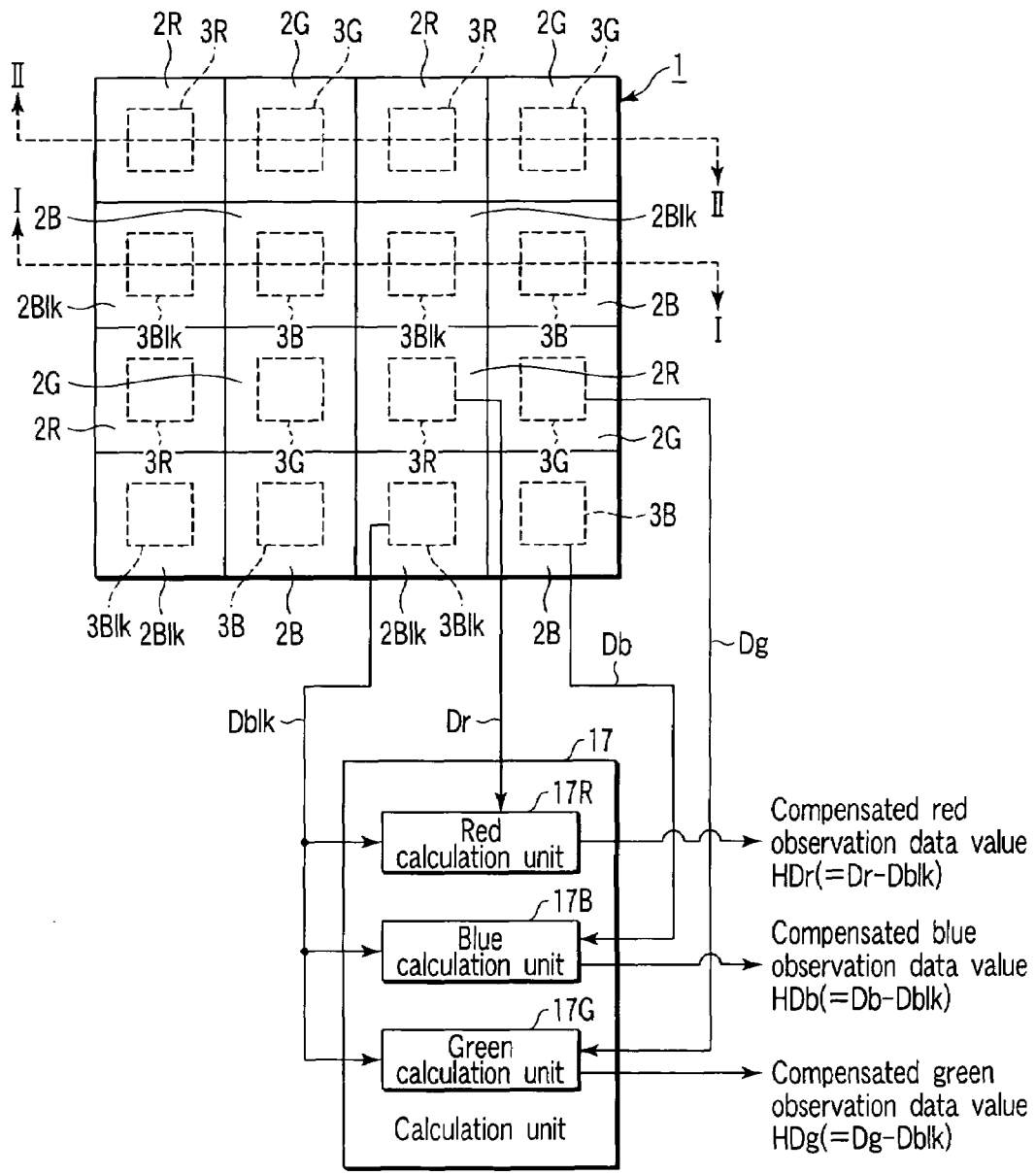
F I G. 1

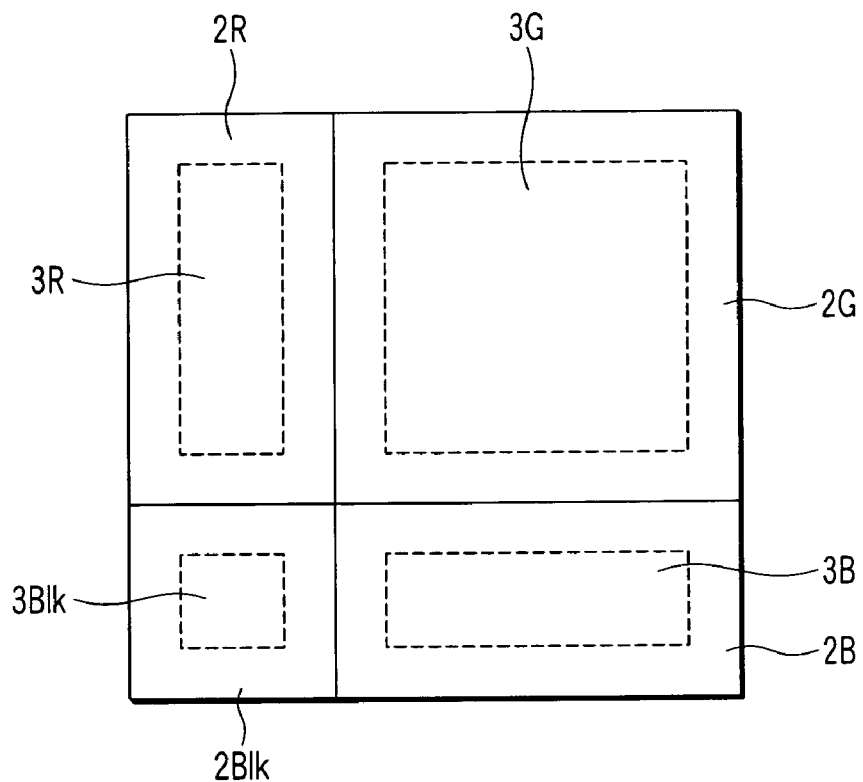
F I G. 12
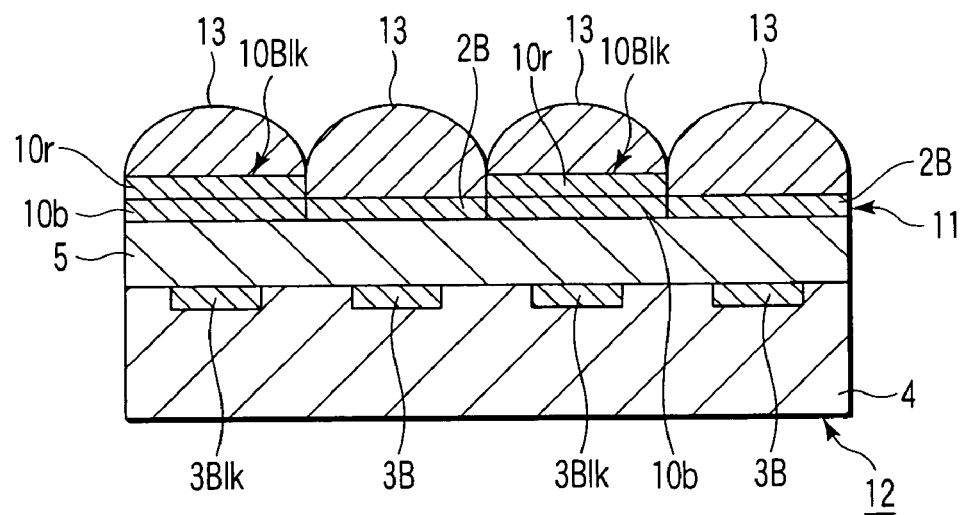
F I G. 13

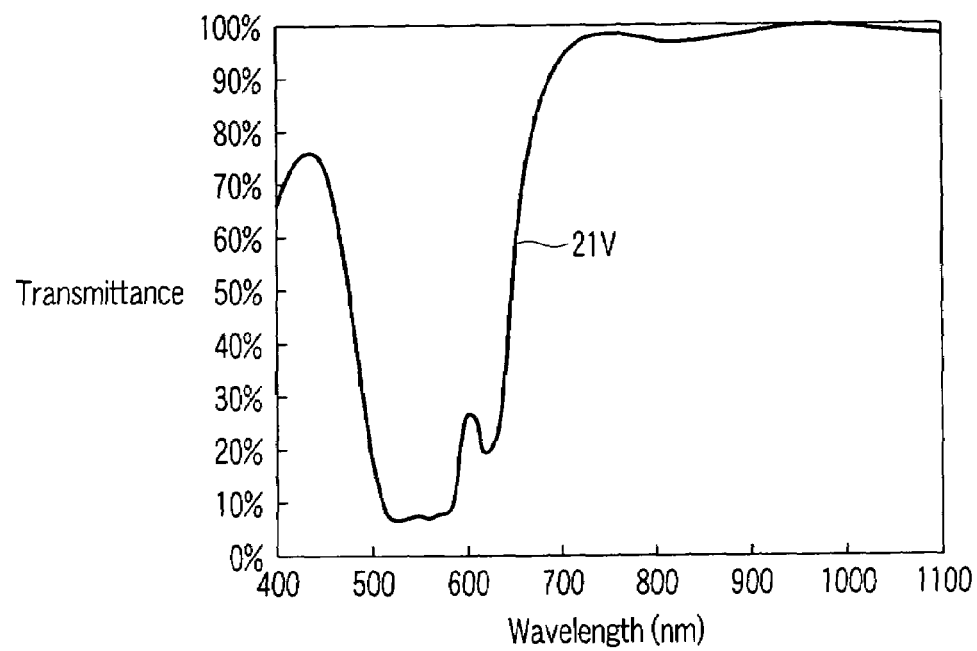
F I G. 24
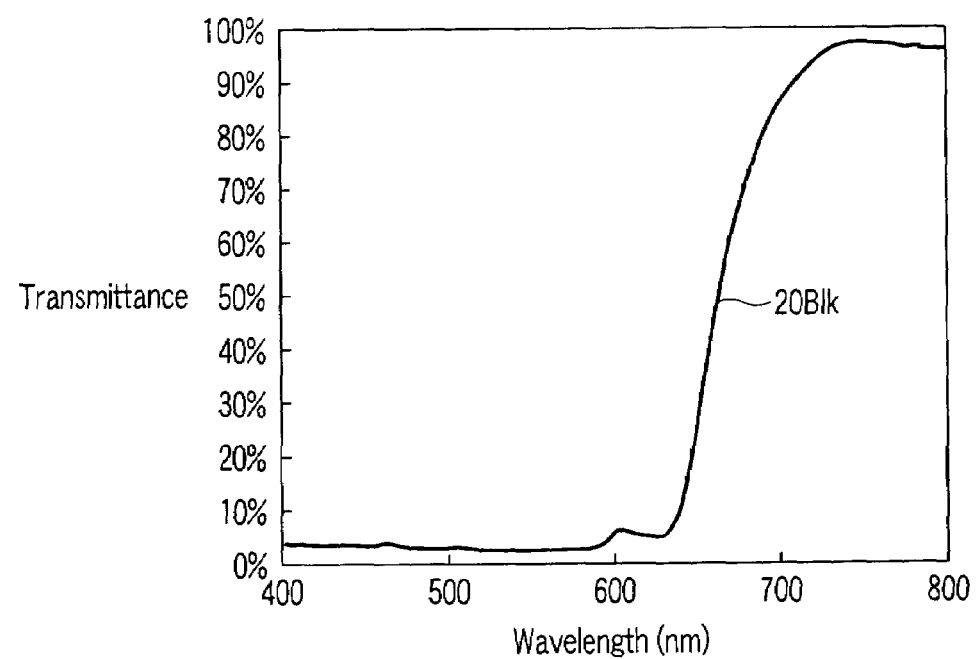
F I G. 25

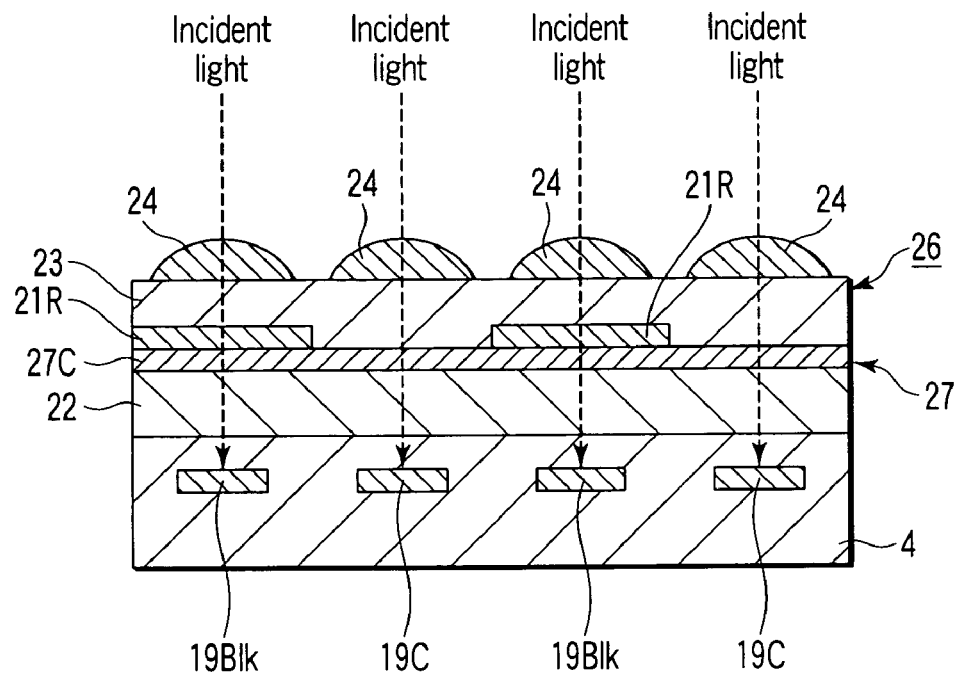
F I G. 26
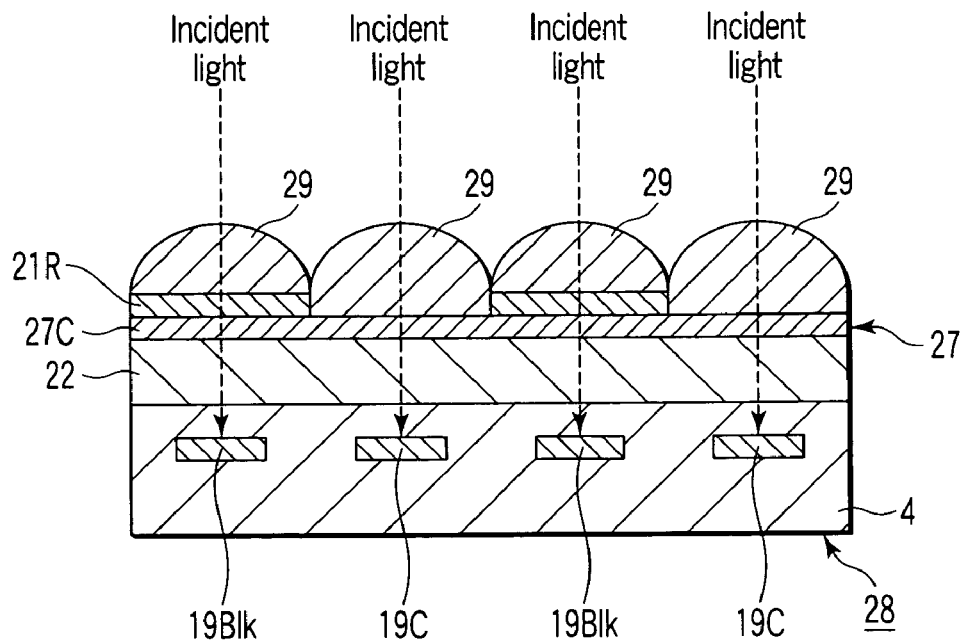
F I G. 27

NOISE-REDUCING IMAGE SENSOR HAVING LIGHT RECEIVING ELEMENTS

CROSS-REFERENCE TO RELATED APPLICATIONS

This is a Continuation Application of PCT Application No. PCT/JP2005/011275, filed Jun. 20, 2005, which was published under PCT Article 21(2) in Japanese.

This application is based upon and claims the benefit of priority from prior Japanese Patent Application No. 2004-193151, filed Jun. 30, 2004, the entire contents of which are incorporated herein by reference.

BACKGROUND OF THE INVENTION

1. Field of the Invention

The present invention relates to an image sensor comprising a light receiving element.

2. Description of the Related Art

A light receiving element converts a light to an electric signal. For example, a light receiving element such as a CMOS or a CCD has a high sensitivity even in a range outside a visible light wavelength range (for example, a wavelength range of 400 nm to 700 nm) as the human visible range, in particular, it also has a high sensitivity in a wavelength range on the wavelength side longer than the visible light wavelength range (hereinafter, it is referred to as the "infrared range". It is for example, a wavelength range of 700 nm to 1,200 nm).

An organic color filter used for extracting a specific color component from an incident light is disposed on the light incident side of the light receiving element. The light receiving element receives the incident light via the organic color filter. Since the color separation of the incident light is carried out by the organic color filter, the color component of an observation target is observed by the light receiving element.

However, since the organic color filter does not have an infrared ray cutting function, it is difficult to carry out the color separation in the infrared range.

In order to prevent the light observation in the infrared range, in some cases a reflection type infrared ray cutting filter comprising an inorganic multi layer film and an infrared ray absorbing type infrared ray cutting filter can be disposed on the light incident side of the light receiving element so as to be used in the optical system of a camera in combination.

FIG. 35 is a graph showing an example of the relationship between the wavelength and the transmittance of the reflection type infrared ray cutting filter and the absorbing type infrared ray cutting filter.

The reflection type infrared ray cutting filter is provided by forming the inorganic multi layer film on a glass plate.

According to the absorbing type infrared ray cutting filter, the infrared ray is absorbed by a dye or a copper ion. There are a plurality of kinds of the infrared ray absorbing type infrared ray cutting filters such as a type using a glass including a metal ion or a type using an organic dye system.

Although the reflection type infrared ray cutting filter comprising the inorganic multi layer film has a high infrared ray cutting function with respect to an incident light in the direction perpendicular to the filter surface, it is difficult to realize a sufficient cutting function with respect to an infrared ray with an angle such as the oblique incidence.

Therefore, for the purpose of compensating the cutting function of the reflection type infrared ray cutting filter comprising the inorganic multi layer film and reducing the influence of the oblique incidence or a re-incidence of the infrared ray, the infrared ray absorbing type infrared ray cutting filter is used in combination with the reflection type infrared ray cutting filter comprising the inorganic multi layer film.

Comparing the reflection type infrared ray cutting filter and the absorbing type infrared ray cutting filter, the absorbing type infrared ray cutting filter is more inexpensive than the reflection type infrared ray cutting filter. Moreover, as mentioned above, the absorbing type infrared ray cutting filter has a better infrared ray cutting performance of an incident light with an angle than that of the reflection type infrared ray cutting filter.

Therefore, in general, the absorbing type infrared ray cutting filter tends to be used more frequently than the reflection type infrared ray cutting filter.

As the conventional image sensor, there is a solid image sensor comprising a color purity compensating filter having a function of compensating the color purity by selectively cutting a light in a specific wavelength range at the border between a red light and a green light and/or the border between a green light and a blue light, and furthermore, having a function of cutting the infrared ray (for example, Jpn. Pat. Appln. KOKAI Publication No. 2000-19322: hereinafter, it is referred to as the document 1).

Moreover, as the conventional image sensor, there is a color image sensor including an infrared ray absorbing agent for dramatically reducing the transmittance in an infrared ray range and transmitting a light in a visible light range for providing an infrared ray cutting ability, provided with a spectral filter in the front surface of the image sensor main body (for example, Jpn. Pat. Appln. KOKAI Publication No. 63-73204: hereinafter it is referred to as the document 2).

However, in the case of using the absorbing type infrared ray cutting filter, since the absorbing type infrared ray cutting filter has a thickness of about 1 to 3 mm, the miniaturization of a camera, or the like may be difficult.

Moreover, in the case of assembling the infrared ray cutting filter in a lens system as a camera part, a cost reduction may be difficult.

The image sensors of the above-mentioned documents 1, 2 comprise the infrared ray cutting filter for covering the entire front surface of the image sensor main body. Therefore, the infrared ray is cut with respect to the all light receiving elements included in the image sensor so that a difference may be generated between the observation by the light receiving elements and the human visual sensitivity.

For example, according to the document 2, as it is shown in FIGS. 2 and 10 of the document 2, the infrared ray cutting filter absorbs a light in the human visible light wavelength range of 550 nm to 700 nm. In the case where the infrared ray is cut with respect to all the light receiving elements included in the image sensor, the green sensitivity, and in particular, the red sensitivity may be deteriorated.

BRIEF SUMMARY OF THE INVENTION

According to the first aspect of the present invention, an image sensor comprises a filter used for an extraction of a specific color component of an incident light, a light receiving element which observes the incident light via the filter, a compensating filter having a transmission restraining characteristic in a visible light wavelength range and a transmission characteristic in a wavelength range on a longer wavelength out of the visible light wavelength range, and a compensating light receiving element which observes the incident light via the compensating filter for compensating an observation result by the light receiving element.

Thereby, the observation result by the compensating light receiving element can be eliminated from the observation result by the light receiving element. Thus, the observation result only in the visible light wavelength range can be found out highly accurately.

According to the second aspect of the present invention, the filter comprises a green filter used for an extraction of a green component, a blue filter used for an extraction of a blue component, and a red filter used for an extraction of a red component. And the light receiving element comprises a green light receiving element which observes the incident light via the green filter, a blue light receiving element which observes the incident light via the blue filter, and a red light receiving element which observes the incident light via the red filter.

According to the third aspect of the present invention, the compensating filter is formed by superimposing at least one of a first filter element used for the extraction of the green component and a second filter element used for the extraction of the blue component, and a third filter element used for the extraction of the red component.

Since a plurality of the filter elements are laminated, the compensating filter having the transmittance restrained in the visible light wavelength range and allowing high transmittance in the infrared range can be realized. Thus, the observation result by the light receiving element can be compensated using the observation result by the compensating light receiving element for observing the incident light via the compensating filter.

According to the fourth aspect of the present invention, the compensating filter has a configuration of superimposing the first filter element and the third filter element.

According to the fifth aspect of the present invention, the compensating filter has a configuration of superimposing the second filter element and the third filter element.

According to the fourth and fifth aspects, the configuration of the compensating filter is specified.

According to the sixth aspect of the present invention, the transmittance of the filter and the transmittance of the compensating filter are adjusted such that the transmittances on the longer wavelength out with respect to the visible light wavelength range are of the same level.

According to the seventh aspect of the present invention, the green filter and the first filter element have a transmittance restraining characteristic in a part of a wavelength range on a longer wavelength out with respect to the visible light wavelength range.

According to the eighth aspect of the present invention, the green filter and the first filter element have a characteristic of restraining a transmittance rise part in the wavelength range on the longer wavelength out of the visible light wavelength range.

According to the ninth aspect of the present invention, the green filter and the first filter element have a characteristic of restraining a transmittance in a wavelength range including a 780 nm wavelength.

Thereby, an observation accuracy deterioration of the green component based on the transmittance rise part in the infrared range can be prevented.

According to the tenth aspect of the present invention, the green filter, the blue filter, the red filter, and the compensating filter are disposed in a rectangular arrangement so as to form a plane for forming a unit of a color separation.

Thereby, the filter and the compensating filter can be disposed adequately.

According to the eleventh aspect of the present invention, an area ratio of the green filter, the blue filter, the red filter and the compensating filter is 4:2:2:1.

Thereby, only by slightly changing an existing image processing software, the existing image processing software after the change can be used for the image sensor.

According to the twentieth aspect of the present invention, the color separation unit includes the compensating filters of a plurality of kinds having different spectral characteristics.

Thereby, the observation results by the image receiving elements can be compensated by the observation results via a plurality of the compensating filters having different characteristics so that the incident light can be observed highly accurately.

According to the thirteenth aspect of the present invention, the image sensor further comprises a restraining unit having a transmission restraining characteristic in a part of the wavelength range on the longer wavelength out with respect to the visible light wavelength range, disposed on a light incident side of the image receiving element and the compensating light receiving element.

According to the fourteenth aspect of the present invention, the restraining unit has a characteristic of restraining a rise part of the transmittance in the wavelength range on the longer wavelength out of the visible light wavelength range.

According to the fifteenth aspect of the present invention, the restraining part has a characteristic of restraining the transmittance in a wavelength range including a 780 nm wavelength.

Thereby, detection of the green component in the infrared range can be prevented so as to prevent the observation accuracy deterioration of the green component for improving the observation accuracy of the incident light.

According to the sixteenth aspect of the present invention, the restraining part is a lens provided in a plane to have the incident light incident thereon.

Thereby, the lower layer part under the lens of the image sensor can be made thinner. Thus, it is possible to improve color performing properties for obtaining the image sensor allowing the bright observation.

According to the seventeenth aspect of the present invention, the image sensor calculates an observation result of the specific color component based on a difference between the observation result by the light receiving element and the observation result by the compensating light receiving element.

Thereby, only the component in the visible light wavelength range out of the incident light can be observed highly accurately.

An image sensor according to the eighteenth aspect of the present invention comprises a filter composed of the optical superimposition of at least one of a first filter element used for an extraction of a green component out of the incident light and a second filter element used for an extraction of a blue component, and a third filter element used for an extraction of a red component, and a light receiving element which observes the incident light via the filter.

For example, the image sensor can be used for an infrared ray sensor.

According to the nineteenth aspect of the present invention, image sensor further comprises a calculation unit which calculates a compensated green observation data value by subtracting an observation data value observed by the compensating light receiving element from an observation data value observed by the green light receiving element, calculates a compensated blue observation data value by subtracting an observation data value observed by the compensating light receiving element from an observation data value observed by the blue light receiving element, and calculates a compensated red observation data value by subtracting an observation data value observed by the compensating light receiving element from an observation data value observed by the red light receiving element.

According to the twentieth aspect of the present invention, the compensating filter is formed by optically superimposing a plurality of colors.

According to the twenty-first aspect of the present invention, the compensating filter is formed by mixing a plurality of coloring materials.

According to the twenty-second aspect of the present invention, the compensating filter is formed by laminating filters of a plurality of colors.

According to the twenty-third aspect of the present invention, the image sensor further comprises a calculation unit which calculates a data value representing an intensity in the visible light wavelength range of the incident light by subtracting an observation data value observed by the compensating light receiving element from an observation data value observed by the red light receiving element.

According to the twenty-fourth aspect of the present invention, the filter comprises a yellow filter used for an extraction of a yellow component, a magenta filter used for an extraction of a magenta component, and a cyan filter used for an extraction of a cyan component, and the light receiving element comprises a yellow light receiving element for observing the incident light via the yellow filter, a magenta light receiving element for observing the incident light via the magenta filter, and a cyan light receiving element for observing the incident light via the cyan filter.

According to the twenty-fifth aspect of the present invention, the compensating filter is formed by the optical superimposition of the cyan component and the red component.

According to the twenty-sixth aspect of the present invention, the compensating filter is formed by the optical superimposition of the violet component and the red component.

According to the twenty-seventh aspect of the present invention, the yellow filter, the magenta filter, the cyan filter, and the compensating filter are disposed in a rectangular arrangement so as to form a plane for forming a unit of a color separation.

According to the twenty-eighth aspect of the present invention, the image sensor further comprises lenses which are disposed on a light incident side of the filter and the compensating filter, and which restrain a transmittance in an infrared range on a boundary region with respect to the visible light wavelength range.

According to the twenty-ninth aspect of the present invention, the image sensor further comprises a resin layer which is disposed in at least one of the light incident side and the light outputting side of the filter and the compensating filter, is disposed on a light incident side of the filter and the compensating filter, and which restrains the transmittance in the infrared range on the border region with respect to the visible light wavelength range.

According to the thirtieth aspect of the present invention, a coloring material which restrains a transmittance in an infrared range on a boundary region with respect to the visible light wavelength range is added to the yellow filter and the magenta filter.

According to the thirty-first aspect of the present invention, the image sensor further comprises a light blocking layer to restrain a reflection of a light not to be directly incident on the light receiving element out of the incident light.

According to the thirty-second aspect of the present invention, the image sensor further comprises a substrate on which the light receiving element is disposed, wherein the light blocking layer is provided in a region other than a region for inputting the incident light in the light receiving element, on an incident side surface of the incident light of the substrate.

According to the thirty-third aspect of the present invention, the light blocking layer has a transmission restraining characteristic in the visible light wavelength range.

BRIEF DESCRIPTION OF THE SEVERAL VIEWS OF THE DRAWING

FIG. 1 is a front view showing an example of an installation state of three color spectral filters and a compensating filter in an image sensor according to the first embodiment of the present invention.

FIG. 12 is a front view showing an example of an area ratio of pixels in an image sensor according to the fourth embodiment of the present invention.

FIG. 13 is a diagram showing an example of a cross section of an image sensor according to the fifth embodiment of the present invention.

FIG. 24 is a graph showing an example of a spectral characteristic of a violet filter.

FIG. 25 is a graph showing a spectral characteristic of the compensating filter formed by an optical superimposition of violet and red.

FIG. 26 is a diagram showing an example of a cross section of an image sensor according to the ninth embodiment of the present invention.

FIG. 27 is a cross-sectional view showing an example of an image sensor according to the tenth embodiment of the present invention.

DETAILED DESCRIPTION OF THE INVENTION

Hereinafter, the embodiments of the present invention will be explained with reference to the drawings. In the following explanation, the same numerals are applied for the same elements and the explanation thereof is omitted.

First Embodiment

In this embodiment, an image sensor included in, for example, a digital camera, a portable phone, a video camera, a linear sensor, a scanner, or the like will be explained.

In this embodiment, the image sensor has color filters disposed on a light incident side of light receiving elements, for allowing an observation of color components of an observation target.

In this embodiment, the image sensor comprising compensating filters having transmittances in an infrared range higher than a transmittance in a visible light wavelength range in addition to spectral filters used for extracting each of green, blue and red components out of an incident light will be explained.

As the spectral characteristics of the compensating filters, transmission restraining characteristics are provided in the visible light wavelength range and transmission characteristics in the infrared range.

FIG. 1 is a front view showing an example of an installation state of three color spectral filters and a compensating filter in the image sensor according to this embodiment. In FIG. 1, an example of a state viewed from the light incident side is shown.

Figure 2:
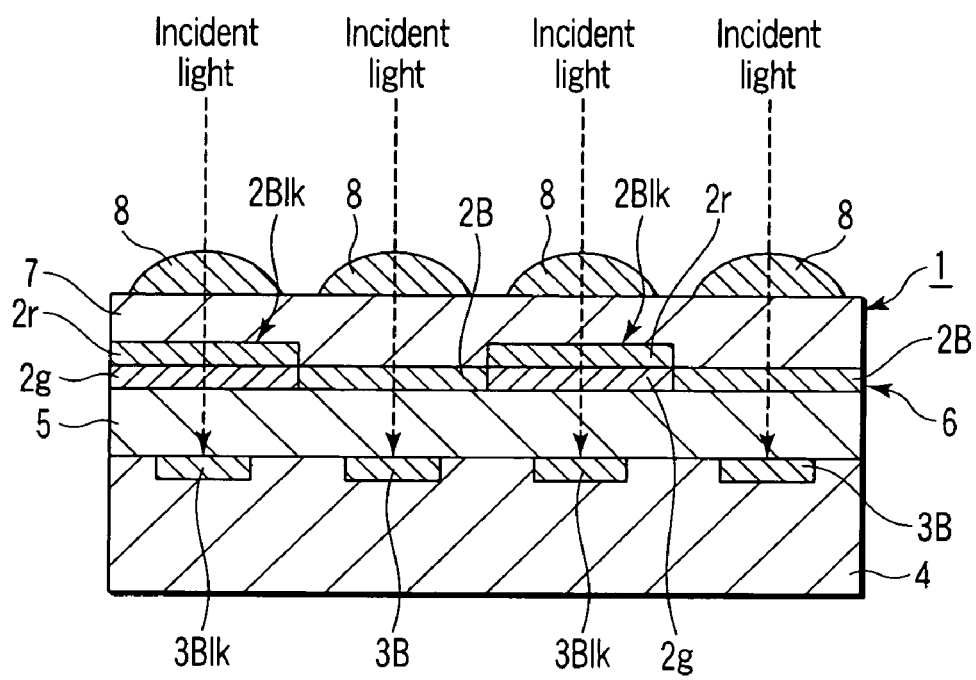
FIG. 2 is a diagram showing the first example of a cross section of the image sensor according to the first embodiment.

FIG. 2 is a diagram showing the first example of a cross section of the image sensor. In FIG. 2, the cross section taken along a line I-I of FIG. 1 is shown.

Figure 3:
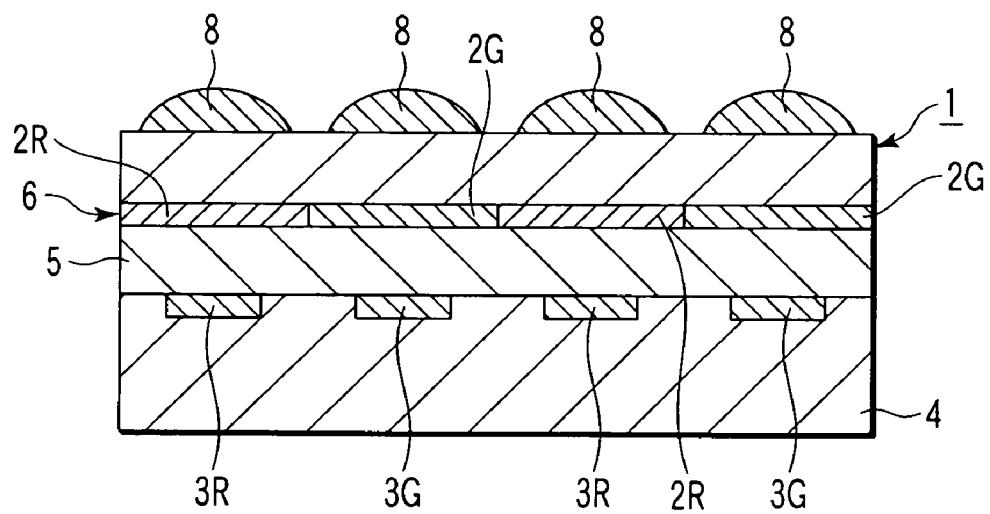
FIG. 3 is a diagram showing the second example of a cross section of the image sensor according to the first embodiment.

FIG. 3 is a diagram showing the second example of a cross section of the image sensor. In FIG. 3, the cross section taken along a line II-II of FIG. 1 is shown.

Spectral filters 2G, 2B, 2R included in the image sensor 1 are color filters used each for extractions of a green component, blue component and red component of the incident light.

A compensating filter 2Blk is a spectral filter having a transmittance of the infrared range higher than the transmittance of the visible light wavelength range. That is, the compensating filter 2Blk has the transmission restraining characteristic in the visible light wavelength range, and the transmission characteristic in the infrared range. In this embodiment, the transmittance of the compensating filter 2Blk is of substantially the same level (same or approximate) as the transmittance of the other spectral filters 2G, 2B, 2R on a longer wavelength out of the visible light wavelength range.

Since the compensating filter 2Blk has the transmission restraining characteristic (low transmission characteristic) in the visible light wavelength range, it looks black visually.

The compensating filter 2Blk is formed by optically superimposing a plurality of coloring materials (such as a pigment or a coloring matter).

As the specific method for realizing an optical superimposition, there are a method of realizing by a lamination structure of filters of a plurality of colors, a method of realizing by a single layer structure of a colored resin with a plurality of coloring materials mixed, or the like. For an adjustment of the color or the transmittance, two or more coloring materials can be used.

In this embodiment, the compensating filter 2Blk has a configuration having a filter element 2g used for an extraction of a green component and a filter element 2r used for an extraction of a red component laminated. In this embodiment, the filter elements 2g, 2r are the same as the spectral filters 2G, 2R, respectively.

A combination of the light receiving element and the filter one by one corresponds to a pixel. The spectral filters 2G, 2B, 2R each correspond to a green pixel, a blue pixel and a red pixel, and the compensating filter 2Blk corresponds to a black pixel.

For example, for the coloring material of the spectral filter 2G, a coloring material prepared by mixing organic pigments C.I. Pigment yellow 139, C.I. Pigment green 36 and C.I. Pigment blue 15:6 can be used.

For example, for the coloring material of the spectral filter 2B, a coloring material prepared by mixing organic pigments C.I. Pigment blue 15:6 and C.I. Pigment violet 23 can be used.

For example, for the coloring material of the spectral filter 2R, a coloring material prepared by mixing organic pigments C.I. Pigment orange 71 and C.I. Pigment yellow 139 can be used.

The light receiving elements 3G, 3B, 3R are for observing the incident light each via the spectral filters 2G, 2B, 2R and calculating a green observation data value, a blue observation data value and a red observation data value.

A compensating light receiving element 3Blk is for observing the incident light via the compensating filter 2Blk for observing a compensating data value used for compensating the green observation data value, the blue observation data value and the red observation data value observed by the light receiving elements 3G, 3B, 3R so as to calculate a compensating observation data value.

The light receiving elements 3G, 3B, 3R and the compensating light receiving element 3Blk are photoelectric transducers each for converting the light received via the spectral filters 2G, 2B, 2R and the compensating filter 2Blk to an electric signal.

FIGS. 2, 3 show an example of the case where the light receiving elements 3G, 3B, 3R and the compensating light receiving element 3Blk are CCDs. However, as the light receiving elements 3G, 3B, 3r and the compensating light receiving element 3Blk, CMOSs may be used.

A calculation unit 17 comprises a green calculation unit 17G, a blue calculation unit 17B and a red calculation unit 17R. The calculation unit 17 has a function of calculating a compensated green observation data value HDg, a compensated blue observation data value HDb, and a compensated red observation data value HDr based on observation data values Dg, Db, Dr, Dblk of the light receiving elements 3G, 3B, 3R and the compensating light receiving element 3Blk.

The green calculation unit 17G subtracts the observation data value Dblk observed by the compensating light receiving element 3Blk from the observation data value Dg observed by the light receiving element 3G for calculating the compensated green observation data value HDg (=Dg−Dblk).

The blue calculation unit 17B subtracts the observation data value Dblk observed by the compensating light receiving element 3Blk from the observation data value Db observed by the light receiving element 3B for calculating the compensated blue observation data value HDb (=Db−Dblk).

The red calculation unit 17R subtracts the observation data value Dblk observed by the compensating light receiving element 3Blk from the observation data value Dr observed by the light receiving element 3R for calculating the compensated red observation data value HDr (=Dr−Dblk).

The light receiving elements 3G, 3B, 3R and the compensating light receiving element 3Blk are provided like a rectangular arrangement on the light incident side surface of a semiconductor substrate 4.

A flattening layer 5 is laminated on the light incident side of the semiconductor substrate 4 provided with the light receiving elements 3G, 3B, 3R and the compensating light receiving element 3Blk.

The spectral filters 2G, 2B, 2R and the compensating filter 2Blk each corresponding to the light receiving elements 3G, 3B, 3R and the compensating light receiving element 3Blk are provided on the light incident side of the flattening layer 5 so as to form a filter layer 6.

That is, the filter layer 6 includes the spectral filters 2G, 2B, 2R and the compensating filter 2Blk. One unit of a color separation is formed with each one of the spectral filters 2G, 2B, 2R and the compensating filter 2Blk.

The spectral filters 2G, 2B, 2R and the compensating filter 2Blk are disposed adjacently like a rectangular arrangement, corresponding to the light receiving elements 3G, 3B, 3R and the compensating light receiving element 3Blk so as to form a surface.

A resin layer 7 is laminated on the light incident side of the filter layer 6.

The resin layer 7 has a characteristic of restraining a transmittance in the infrared range so as to eliminate (absorb or reflect) an incident light component of the infrared range.

In this embodiment, the resin layer 7 has a characteristic of restraining a rise part of a transmittance in the infrared range, for example, a characteristic of restraining a transmittance in a wavelength range including a 780 nm wavelength or between 700 nm or 800 nm so as to provide a characteristic of eliminating an infrared range component including a 780 nm wavelength out of the incident light. Here, the rise part of the transmittance in the infrared range is included in a wavelength range on a border region of the visible light wavelength range and the infrared range in the infrared range.

That is, the resin layer 7 has a transmittance adjusting function of providing the transmittance in the infrared range of the spectral filters 2G, 2B, 2R and the compensating filter 2Blk at the same level.

For example, for the resin layer 7, a phthalocyanine based compound and a cyanine based compound are added. In this case, an infrared ray absorbing function having an infrared ray absorption peak in the vicinity of 780 nm can be provided to the resin layer 7.

micro lenses 8 corresponding to the light receiving elements 3G, 3B, 3R and the compensating light receiving element 3Blk is provided on the light incident side of the resin layer 7. The micro lenses 8 are disposed so as to be paired with each spectral filter 2G, 2B, 2R and the compensating filter 2Blk. The micro lenses 8 are formed with an acrylic resin, or the like for improving light collecting properties of the incident light with respect to the light receiving elements 3G, 3B, 3R and the compensating light receiving element 3Blk.

In this embodiment, thicknesses of the spectral filters 2G, 2B, 2R were 1.1 µm, pitches of the spectral filters 2G, 2B, 2R were 2.6 µm, an average thickness of the flattening layer 5 was 0.6 µm, and an average thickness of the resin layer 7 was 2 µm. In order to realize the flatness, the flattening layer 5 and the resin layer 7 have a thick portion and a thin portion.

Figure 4:
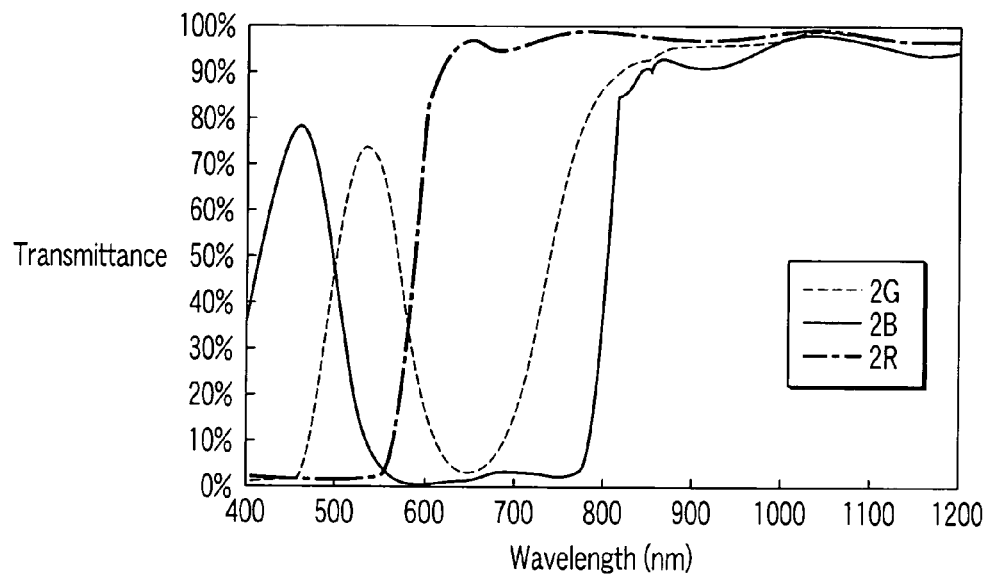
FIG. 4 is a graph showing an example of relationships between transmittances and wavelengths of spectral filters of each color.

FIG. 4 is a graph showing an example of relationships between transmittances and wavelengths (spectral characteristics) of the spectral filters 2G, 2B, 2R of each color.

FIG. 4 shows the light transmittances at each wavelength from 400 nm to 1,200 nm.

In FIG. 4, the transmittance of the spectral filter 2G rises gradually from the vicinity of 640 nm as the wavelength becomes longer.

The transmittance of the spectral filter 2B rises rapidly in the vicinity of 800 nm of the infrared range as the wavelength becomes longer.

A general light receiving element is for an observation in a wavelength range of 400 nm to 1,200 nm. Therefore, according to the conventional image sensor, a component in the infrared range of the incident light is cut with an infrared ray cutting filter for the infrared range of a wavelength longer than the visible light wavelength range (for example, 400 nm to 700 nm), and a color separation is carried out using a spectral filter in a residual visible light wavelength range.

On the other hand, the image sensor 1 according to this embodiment comprises the compensating filter 2Blk having a laminated structure of the green filter element 2g and the red filter element 2r, in addition to the spectral filters 2G, 2B, 2R.

Figure 5:
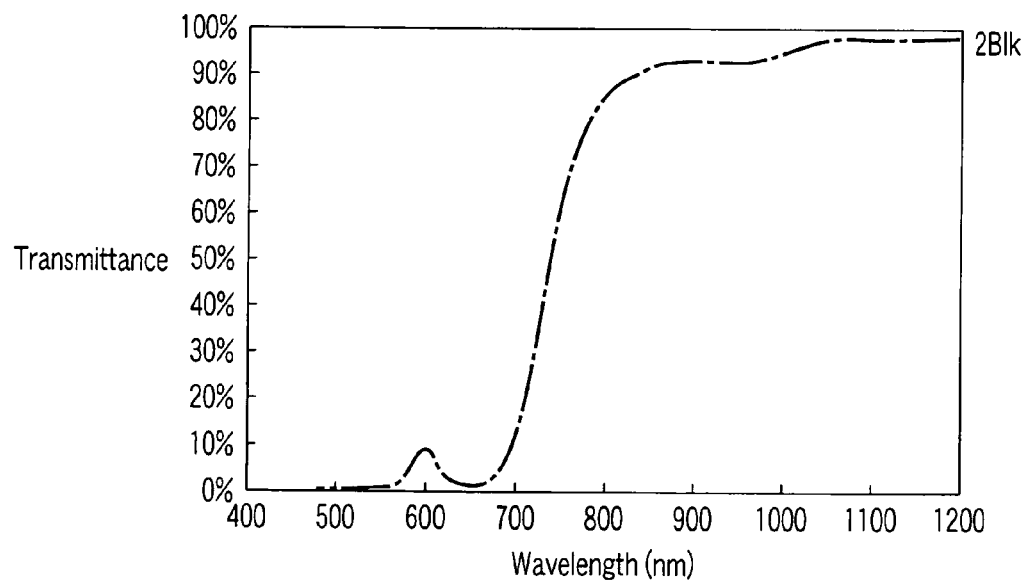
FIG. 5 is a graph showing an example of a relationship between a transmittance and a wavelength of the compensating filter according to the first embodiment.

FIG. 5 is a graph showing an example of a relationship between a transmittance and a wavelength (spectral characteristic) of the compensating filter 2Blk according to this embodiment.

The transmittance of the compensating filter 2Blk is a product value of the transmittance of the spectral filter 2G and the transmittance of the spectral filter 2R in FIG. 4.

The compensating filter 2Blk has a transmittance higher in the infrared range than in the visible light wavelength range so as to provide a characteristic with a transmittance restrained in the visible light wavelength range and higher in the infrared range. That is, the compensating filter 2Blk has the transmission restraining characteristic in the visible light wavelength range and the transmission characteristic in the infrared range. In this embodiment, the transmittance of the compensating filter 2Blk in the infrared range is substantially of the same level as the transmittance of the other spectral filters 2G, 2B, 2R.

Then, in this embodiment, it is found out that a highly accurate color separation can be enabled by subtracting an integration value of the transmittance on the longer wavelength side from about 640 nm of the compensating filter 2Blk from the integration value of the transmittance of each spectral filter 2G, 2B, 2R.

Here, the transmittance of the spectral filter for green 2G will be explained.

The transmittance of the spectral filter for green 2G has a characteristic of rising once as the wavelength becomes longer from the vicinity of 450 nm, and furthermore, rising again as the wavelength becomes longer from the vicinity of 650 nm.

Therefore, although the rising range of the transmittance on the longer wavelength side (vicinity of 780 nm) is a red range or the infrared range, the light is transmitted also in the spectral filter for green 2G. Therefore, in this state, the light receiving element for green 3G observes a component in the red range or the infrared range as a green component.

Then, in this embodiment, the transmittance in the vicinity of 780 nm (for example, between 700 nm to 800 nm) as the transmittance rise part in the infrared range in the spectral filter for green 2G is restrained by the resin layer 7.

Figure 6:
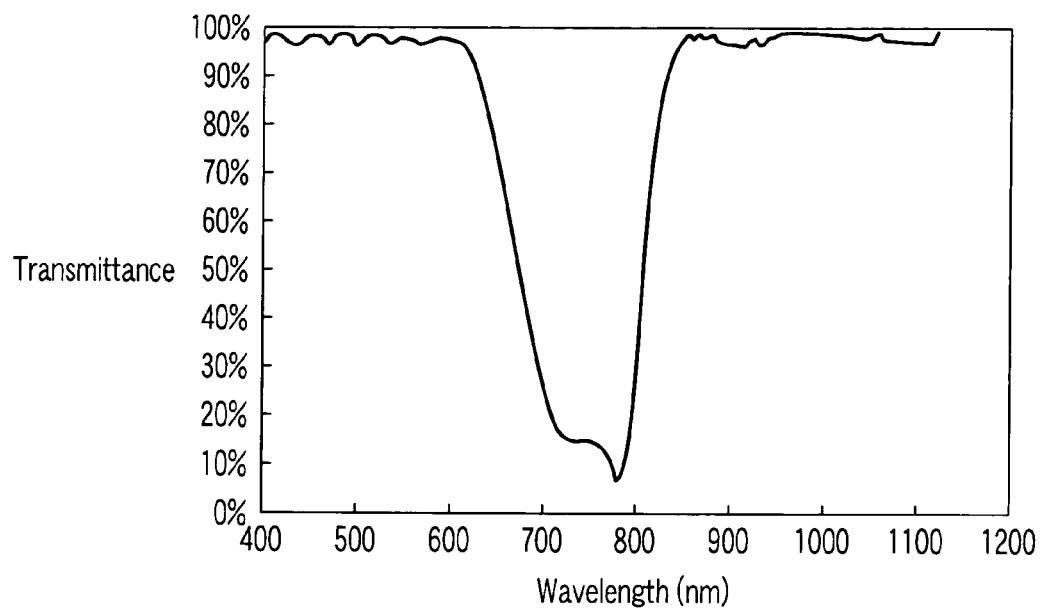
FIG. 6 is a graph showing an example of a relationship between a transmittance and a wavelength of a resin layer.

FIG. 6 is a graph showing an example of a relationship between a transmittance and a wavelength of the resin layer 7.

With the resin layer 7 and the spectral filter for green 2G superimposed for observing the incident light by the green light receiving element 3G via the resin layer 7 and the spectral filter for green 2G, observation of the component in the red wavelength range or the infrared range by the green light receiving element 3G is prevented.

In this embodiment, the highly accurate color separation can be enabled by obtaining the transmittance for observing each color by subtracting the area of the transmittance (integration value) of the case of combining the resin layer 7 with the compensating filter 2Blk from the area of the transmittance (integration value) of the case of combining the resin layer 7 with the spectral filters 2G, 2B, 2R of each color.

Hereinafter, observation by the image sensor 1 according to this embodiment will be explained.

The light receiving element is in general for observing the light wavelength of about 400 nm to 1,200 nm.

Out of this, the visible light wavelength range to be sensed by the human is in general considered to be the range of about 400 nm to 700 nm.

Therefore, by observing only the component in the visible light wavelength range out of the light components measured by each light receiving element, the observation results closer to the human visual sense can be obtained.

However, as shown in FIG. 4, the spectral filters 2G, 2B, 2R of each color have a high transmittance also in the infrared range as the wavelength range longer than the visible light wavelength range.

Therefore, if the lights separated by the spectral filters 2G, 2B, 2R are observed as they are by the light receiving elements, the components in the infrared range not to be sensed by the human out of the incident light components are also observed by the light receiving elements so that the observation results different from the human visual sense may be obtained.

Then, according to the image sensor 1 according to this embodiment, the observation results by the light receiving elements are compensated, using the observation result with respect to the infrared range.

In this embodiment, the incident light is observed by the light receiving elements 3G, 3B, 3R and the compensating light receiving element 3Blk via the micro lenses 8, the resin layer 7, and furthermore, any of the spectral filters 2G, 2B, 2R and the compensating filter 2Blk.

That is, in this embodiment, the observation data values Dg, Db, Dr, Dblk by the light receiving elements 3G, 3B, 3R and the compensating light receiving element 3Blk are influenced by the transmittance of the resin layer 7, and furthermore, each influenced by the transmittance of the spectral filters 2G, 2B, 2R and the compensating filter 2Blk.

Specifically, the transmittance of the incident light in the case of passing through the resin layer 7 and the spectral filter 2G is the product of the transmittance of the resin layer 7 and the transmittance of the spectral filter 2G.

The transmittance of the incident light in the case of passing through the resin layer 7 and the spectral filter 2B is the product of the transmittance of the resin layer 7 and the transmittance of the spectral filter 2B.

The transmittance of the incident light in the case of passing through the resin layer 7 and the spectral filter 2R is the product of the transmittance of the resin layer 7 and the transmittance of the spectral filter 2R.

The transmittance of the incident light in the case of passing through the resin layer 7 and the compensating filter 2Blk is the product of the transmittance of the resin layer 7 and the transmittance of the compensating filter 2Blk.

Figure 7:
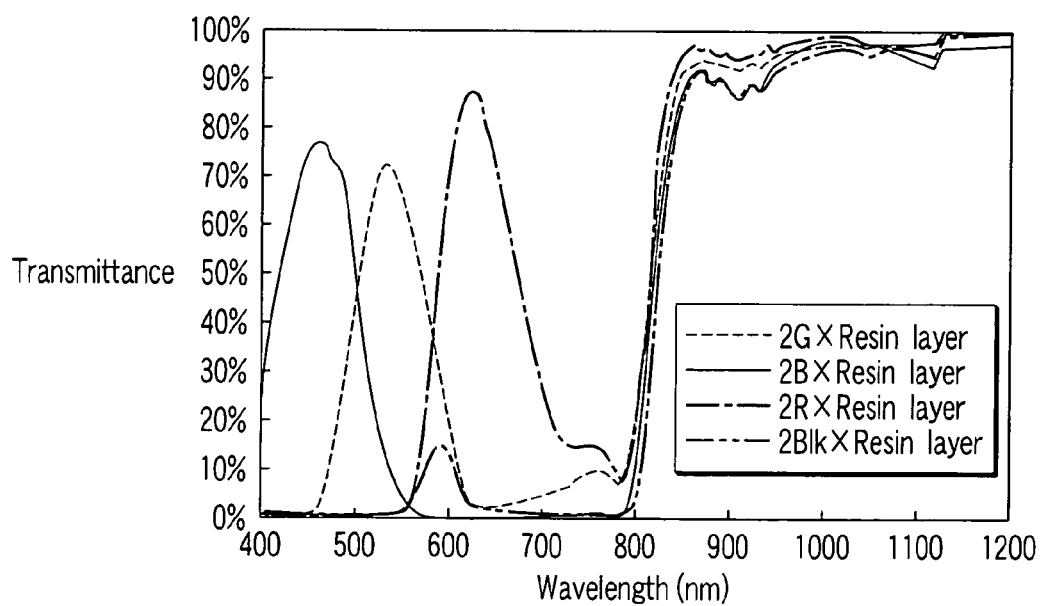
FIG. 7 is a graph showing an example of relationships between transmittances and wavelengths in the case of combining the resin layer with the spectral filters and the compensating filter.

FIG. 7 is a graph showing an example of relationships between transmittances and wavelengths in the case of combining the resin layer 7 with the spectral filters 2G, 2B, 2R and the compensating filter 2Blk.

The transmittances in the case of combining the resin layer 7 with the spectral filters 2G, 2B, 2R and the compensating filter 2Blk become lower in the wavelength range in the vicinity of 780 nm than the case of FIGS. 4 and 5 by the function of the resin layer 7 shown in FIG. 6.

Moreover, the spectral characteristics of the combination of the resin layer 7 with the spectral filters 2G, 2B, 2R and the compensating filter 2Blk are in an approximate state in the infrared range.

Then, the transmittance in the case of combining the resin layer 7 with the compensating filter 2Blk is extremely low in the visible light wavelength range, and the transmittance is higher to the same degree as the case of combining the resin layer 7 with each spectral filter 2G, 2B, 2R in the infrared range out of the longer side of the visible light wavelength range.

Therefore, the compensating light receiving element 3Blk can observe the incident light component in the infrared range rather than the visible light wavelength range. Then, by compensating the observation results by the light receiving elements 3G, 3B, 3R with the observation result by the compensating light receiving element 3Blk, the observation data values of each color only in the visible light wavelength range can be obtained.

The effects of the image sensor 1 according to this embodiment heretofore described will be explained.

In this embodiment, the component in the range including 780 nm in the infrared range out of the incident light is absorbed by the resin layer 7.

Furthermore, the incident light is observed via each spectral filter 2G, 2B, 2R as well as the incident light is observed via the compensating filter 2Blk of the high transmittance in the infrared range.

Then, by subtracting the observation data value via the resin layer 7 and the compensating filter 2Blk from the observation data values of green, blue, red via the resin layer 7 and each spectral filter 2G, 2B, 2R, the observation data values of green, blue, red are compensated so as to obtain the compensated observation data values of green, blue, red. Thereby, the observation data values in the visible light wavelength range out of the incident light can be obtained highly accurately.

In this embodiment, an infrared ray cutting filter included in an optical system of the conventional camera module can be omitted so as to make a lens optical system and the camera thinner, thereby making it possible to carry out the observation by the light receiving element efficiently and appropriately.

In the case of using the conventional absorbing type infrared ray cutting filter, the red, green sensitivity may be lowered as well as the color performing properties may be lowered. That is, in the case of comprising the infrared ray cutting filter having the spectral characteristic as shown in FIG. 35 on the entire front surface of the image sensor, since the component in the 550 nm to 700 nm wavelength range of the visible light wavelength range is also absorbed by the infrared ray cutting filter, the green, and in particular, red sensitivity may be lowered.

Figure 35:
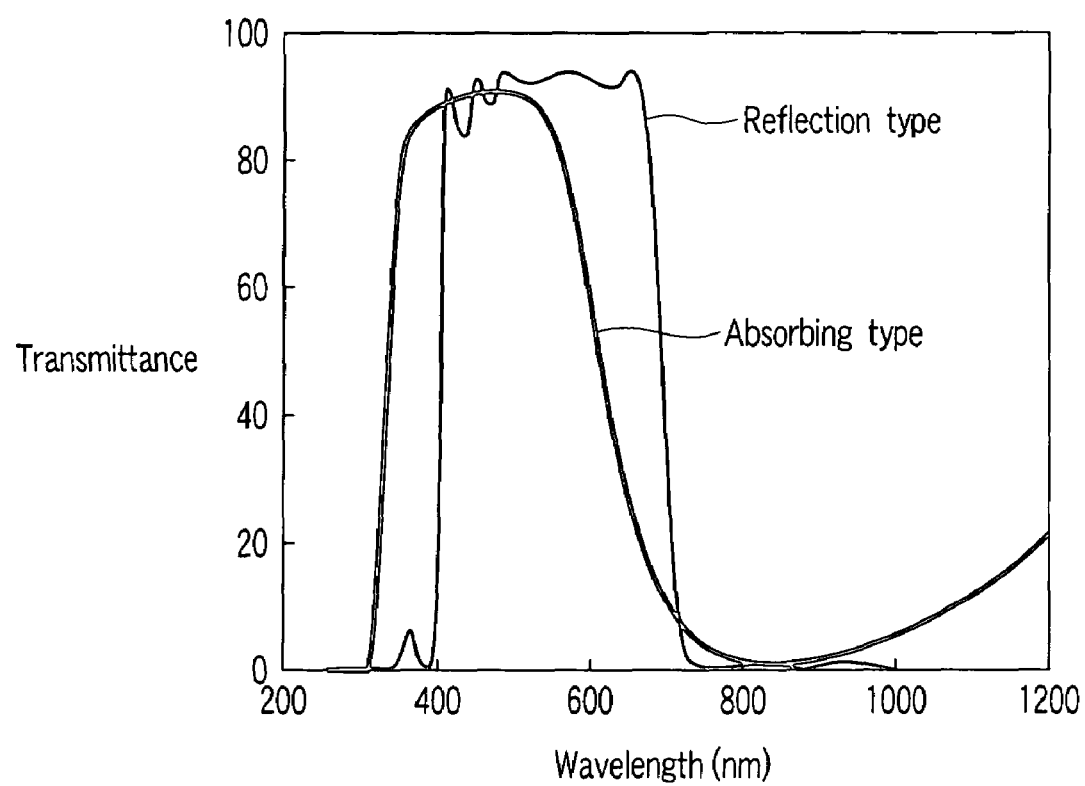
FIG. 35 is a graph showing an example of relationships between wavelengths and transmittances of a reflection type infrared ray cutting filter and an absorbing type infrared ray cutting filter.

Moreover, in the case of comprising the infrared ray cutting filter on the entire front surface of the image sensor, due to the influence of the spectral characteristic of FIG. 35, the slight red color reproduction by the individual light receiving elements provided in general by 300,000 to 10,000,000 pieces may be deteriorated.

However, since the absorbing type infrared ray cutting filter needs not be used in this embodiment, the sensitivity decline in the visible light wavelength range can be avoided, and moreover, the color performing properties can be improved so that the color reproduction properties can be improved.

In this embodiment, the resin layer 7 for restraining the transmittance in the range in the vicinity of the light wavelength 780 nm is provided in the image sensor 1.

In FIG. 4, the transmittance on the longer wavelength side with respect to the light wavelength 640 nm differs in the green spectral filter 2G and the blue spectral filter 2B, and the transmittance difference becomes maximum at around 780 nm.

However, in this embodiment, by restraining the transmittance in the wavelength range of about 780 nm by the resin layer 7, the transmittance of the light transmitting the resin layer 7 and the green spectral filter 2G and the transmittance of the light transmitting the resin layer 7 and the blue spectral filter 2B can be made substantially the same on the longer wavelength side with respect to 640 nm, so that they can be approximate with the transmittance of the light transmitting the resin layer 7 and the compensating filter 2Blk on the longer wavelength side with respect to 640 nm.

Thereby, a highly accurate color separation can be carried out by subtracting the area of the transmittance (integration value) of the combination of the resin layer 7 and the compensating filter 2Blk from the area of the transmittances (integration values) of the combinations of the resin layer 7 and each color spectral filter 2G, 2B, 2R.

In the case of using the conventional infrared ray cutting filter, since the light is absorbed by the infrared ray cutting filter from around 550 nm, the red or green sensitivity may be lowered. However, in this embodiment, since the light is absorbed on the longer wavelength side with respect to about 700 nm, which is longer than the visible range, the red and green color performing properties can be improved.

That is, in this embodiment, since the infrared ray cutting filter needs not be provided on the light incident side of the light receiving element, the image sensor can be made thinner.

Moreover, in this embodiment, since the infrared ray cutting filter needs not be provided, the blue and red observation results of the incident light are not influenced by the infrared ray cutting filter in the visible light wavelength range, thereby making it possible to prevent the observation results by the light receiving elements for blue and red from lowering and to improve the color performing properties.

Second Embodiment

In this embodiment, a modified example of the above-mentioned first embodiment will be explained.

In the above-mentioned first embodiment, for reducing the difference between the transmittance of the spectral filter 2G and the transmittance of the spectral filter 2B in the infrared range and adjusting the transmittance in the infrared range, the characteristic of restraining the transmittance in the wavelength range including 780 nm is provided in the resin layer 7.

On the other hand, in this embodiment, the green spectral filter 2G itself is provided with a characteristic of restraining the transmittance in the wavelength range including 780 nm as the infrared range. Thereby, the color separation can be enabled in the same manner as in the above-mentioned first embodiment.

In order to restrain the transmittance in the wavelength range including the 780 nm wavelength in the infrared range, an organic pigment may be added to the green spectral filter 2G. Moreover, an infrared absorbing material may be added to the green spectral filter 2G. Furthermore, an infrared ray absorbing agent layer may be formed on the incident side or the output side of the green spectral filter 2G.

As the infrared ray absorbing agent, an anthraquionone based compound, a phthalocyanine based compound, a cyanine based compound, a polymethylene based compound, an aluminum based compound, a diimonium based compound, an imonium based compound, an azo based compound, or the like can be used.

Moreover, in this embodiment, for restraining the transmittance in the wavelength range including the 780 nm wavelength in the infrared range, an ultraviolet ray absorbing agent may be used. As the ultraviolet ray absorbing agent, a benzotriazol based compound, a benzophenone based compound, a salicylic acid based compound, a coumarin based compound, or the like can be used.

Moreover, in this embodiment, to the infrared ray absorbing agent or the ultraviolet ray absorbing agent mentioned above, for example, a light stabilizing agent such as a hindered min based compound, or a quencher may be added.

For absorbing the infrared ray, an infrared ray absorbing compound or an infrared ray absorbing agent may be added to a transparent resin. Moreover, an infrared ray absorbing compound or an infrared ray absorbing agent may be assembled to a transparent resin by a pendant system (a system of assembling in a resin molecule chain in the form of a reaction type infrared ray absorbing agent such as a reactive dye).

Third Embodiment

In this embodiment, a modified embodiment of the above-mentioned first and second embodiments will be explained. In the above-mentioned first and second embodiments, the compensating filter 2Blk comprises the green filter element 2g and the red filter element 2r.

On the other hand, in this embodiment, instead of the compensating filter 2Blk, a compensating filter comprising a blue filter element and a red filter element is used.

Figure 8:
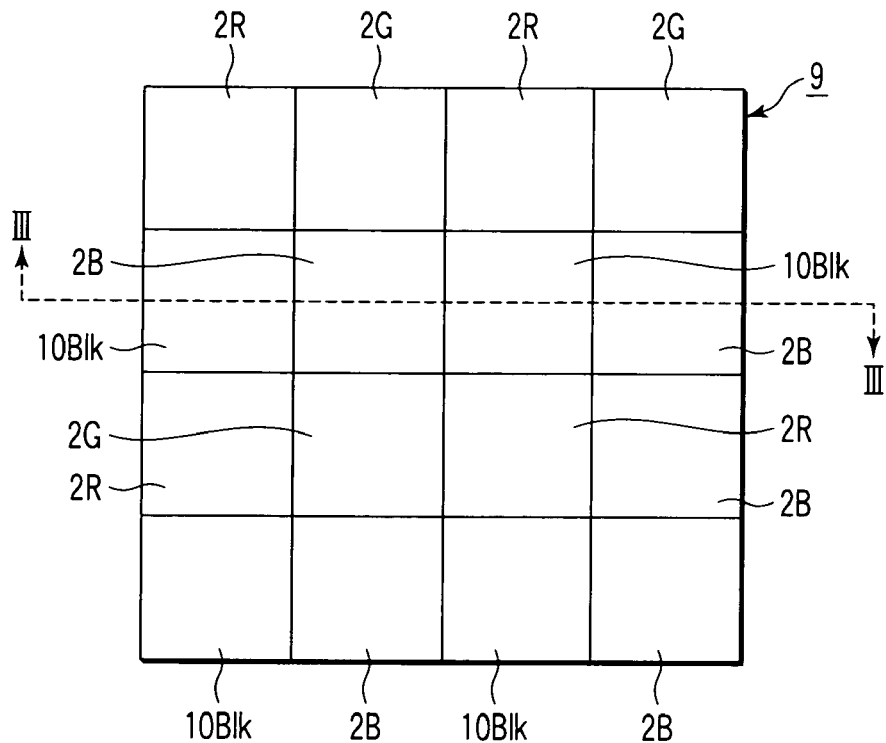
FIG. 8 is a front view showing an example of an arrangement state of three color spectral filters and a compensating filter in an image sensor according to the third embodiment of the present invention.

FIG. 8 is a front view showing an example of an arrangement state of the three color spectral filters 2G, 2B, 2R and the compensating filter in the image sensor according to this embodiment. In FIG. 8, an example viewed from the light incident side is shown. In FIG. 8, the calculation unit 17 is omitted.

Figure 9:
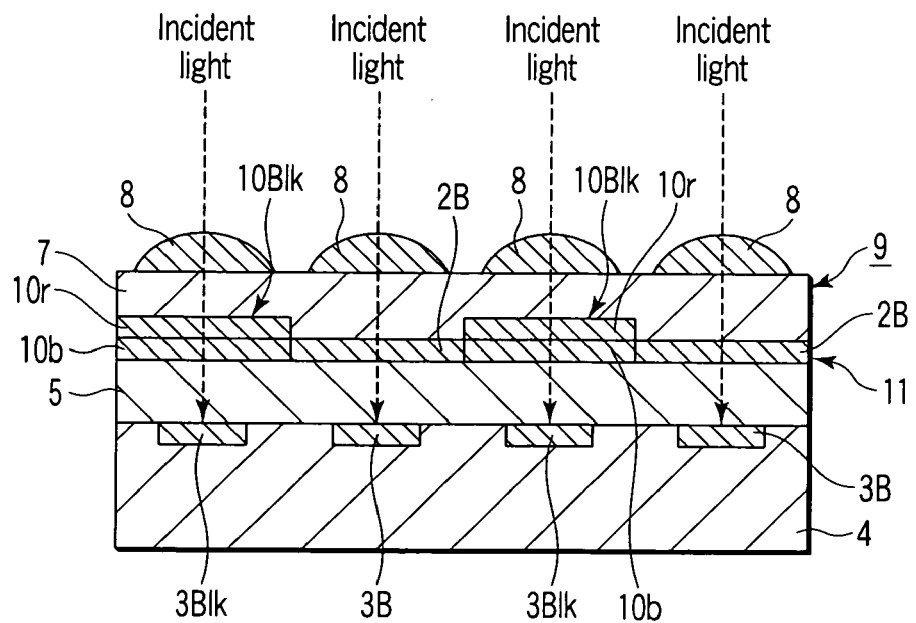
FIG. 9 is a diagram showing an example of a cross section of the image sensor according to the third embodiment.

FIG. 9 is a diagram showing an example of a cross section of the image sensor. FIG. 9 shows the cross section taken along a line III-III of FIG. 8.

The image sensor 9 comprises a compensating filter 10Blk instead of the compensating filter 2Blk of the image sensor 1 according to the above-mentioned first embodiment. The compensating filter 10Blk has a transmission restraining characteristic in the visible light wavelength range and a transmission characteristic in the infrared range. The compensating filter 10Blk corresponds to a black pixel.

The compensating filter 10Blk has a configuration having a filter element 10b used for an extraction of a blue component and a filter element 10r used for an extraction of a red component laminated. In this embodiment, the filter elements 10b, 10r are the same as the spectral filters 2B, 2R, respectively.

In the image sensor 9, the spectral filters 2G, 2B, 2R and the compensating filter 10Blk each corresponding to the light receiving elements 3G, 3B, 3R and the compensating light receiving element 3Blk are laminated on the light incident side of the flattening layer 5 so as to form a filter layer 11.

The image sensor 9 according to this embodiment comprises the compensating filter 10Blk with the blue filter element 10b and the red filter element 10r laminated.

Figure 10:
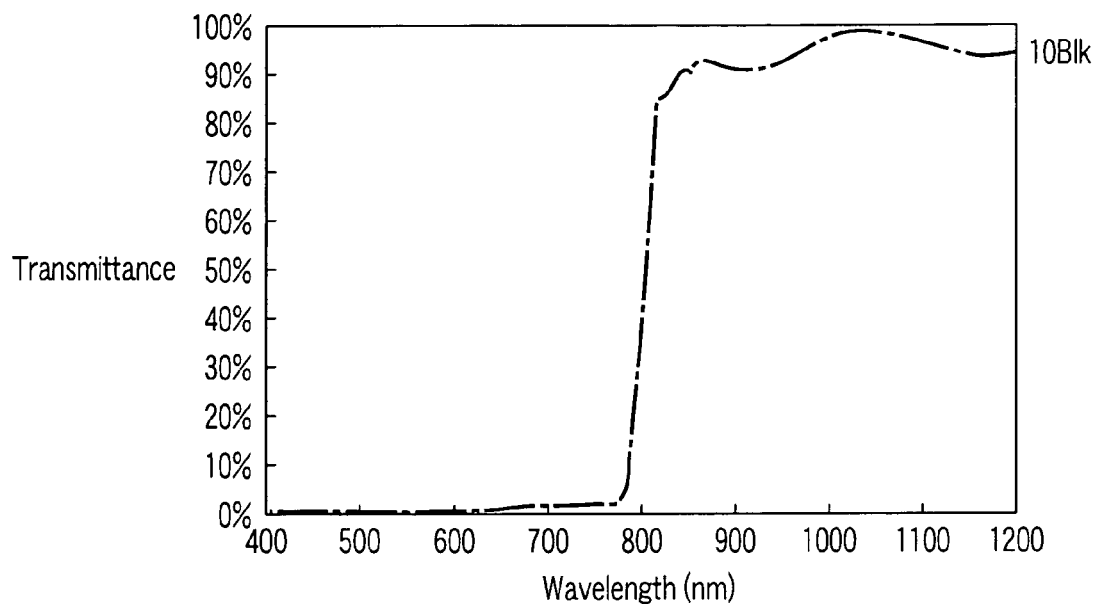
FIG. 10 is a graph showing an example of a relationship between a transmittance and a wavelength of a compensating filter according to the third embodiment.

FIG. 10 is a graph showing an example of a relationship between a transmittance and a wavelength (spectral characteristic) of the compensating filter 10Blk according to this embodiment.

The transmittance of the compensating filter 10Blk is a product value of the transmittance of the spectral filter 2B and the transmittance of the spectral filter 2R in FIG. 4.

The compensating filter 10Blk has characteristics with a transmittance in the infrared range higher than that of the visible light wavelength range, the transmittance is restrained in the visible light wavelength range, and a high transmittance is provided in the infrared range. That is, the compensating filter 10Blk has a transmission restraining characteristic in the visible light wavelength range and a transmission characteristic in the infrared range. The transmittance of the compensating filter 10Blk is of substantially the same level (same or approximate) as the transmittance of the other spectral filters 2G, 2B, 2R on the longer wavelength out of the visible light wavelength range.

Then, in this embodiment, by subtracting an integration value of the transmittance on the longer wavelength out of about 700 nm of the compensating filter 10Blk from integration values of the transmittances of each spectral filter 2G, 2B, 2R, a highly accurate color separation can be enabled.

Therefore, in this embodiment, the compensating filter 10Blk having the transmission restraining characteristic in the visible light wavelength range and the transmission characteristic in the infrared range is provided on an incident plane so as to be used for the color separation.

Figure 11:
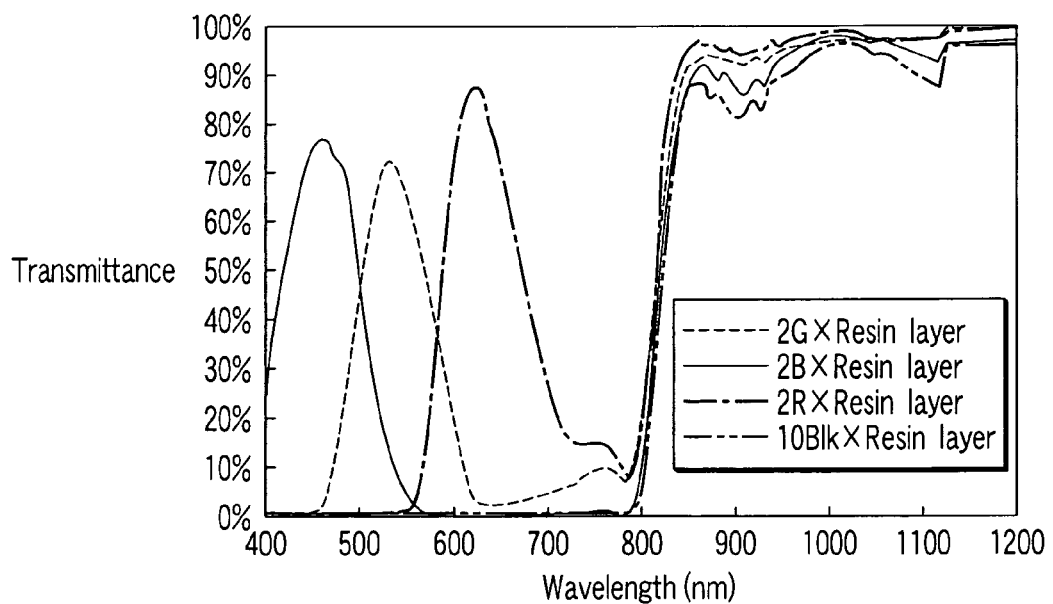
FIG. 11 is a graph showing an example of relationships between transmittances and wavelengths in the case of combining a resin layer with spectral filters and the compensating filter.

FIG. 11 is a graph showing an example of relationships between transmittances and wavelengths in the case of combining the resin layer 7 with the spectral filters 2G, 2B, 2R and the compensating filter 10Blk.

In FIG. 11, the transmittance of the resin layer 7 having the transmission restraining characteristic in the range in the vicinity of 780 nm is multiplied by the transmittances of each color spectral filter 2G, 2B, 2R and the compensating filter 10Blk so as to be reflected in the spectral characteristics.

The transmittance in the case of combining the resin layer 7 with the spectral filters 2G, 2B, 2R and the compensating filter 10Blk becomes lower in the wavelength range in the vicinity of 780 nm due to a function of the resin layer 7 shown in FIG. 6 compared with the case of FIGS. 4, 5.

Moreover, the spectral characteristics of the combination of the resin layer 7 with the spectral filters 2G, 2B, 2R and the compensating filter 10Blk are in an approximate state in the infrared range.

Then, the transmittance in the case of combining the resin layer 7 with the compensating filter 10Blk is extremely low in the visible light wavelength range, and the transmittance is higher to the same degree as the case of combining the resin layer 7 with each spectral filter 2G, 2B, 2R in the infrared range on the longer out of the visible light wavelength range.

That is, the spectral characteristics in the case of combining the resin layer 7 with the spectral filters 2G, 2B, 2R and the compensating filter 10Blk are adjusted such that the transmittances in the infrared range are of the same level as to the spectral filters 2G, 2B, 2R and the compensating filter 2Blk.

Therefore, the compensating light receiving element 3Blk corresponding to the compensating filter 10Blk can observe the incident light component in the infrared range rather than the visible light wavelength range. Then, by compensating the observation results by the light receiving elements 3G, 3B, 3R with the observation result by the compensating light receiving element 3Blk, the observation data values of each color only in the visible light wavelength range can be obtained.

According to this embodiment heretofore explained, the transmittances for observing each color can be obtained so as to enable the highly accurate color separation by subtracting the area of the transmittance (integration value) of the case of combining the resin layer 7 with the compensating filter 10Blk from the area of the transmittances (integration values) of the case of combining the resin layer 7 with the spectral filters 2G, 2B, 2R of each color.

Moreover, in FIG. 7, the transmittance in the case of combining the resin layer 7 and the compensating filter 2Blk rises slightly in the vicinity of 600 nm in the visible light wavelength range.

However, in FIG. 11 in this embodiment, the transmittance in the case of combining the resin layer 7 and the compensating filter 10Blk is restrained to a low level over the entire visible light wavelength range.

Therefore, in this embodiment, the observation in the vicinity of 600 nm can be carried out highly accurately so as to improve in particular the green color performing property compared with the case of the above-mentioned first embodiment.

Fourth Embodiment

In this embodiment, a modified embodiment of the above-mentioned first to third embodiments will be explained.

In this embodiment, a plane is formed by disposing in a rectangular arrangement spectral filters 2G, 2B, 2R, and at least one of a compensating filter 2Blk and a compensating filter 10Blk. And, the spectral filters 2G, 2B, 2R and at least one of the compensating filter 2Blk and the compensating filter 10Blk form a unit of a color separation. In this embodiment, the color separation units are provided on the incident plane.

The color separation unit may include the spectral filters 2G, 2B, 2R and both of the compensating filters 2Blk, 10Blk.

Moreover, the color separation unit may include the two green spectral filers 2G, the spectral filters 2b, 2R and both of the compensating filters 2Blk, 10Blk.

Moreover, it is also possible that a color separation unit comprises one compensating filter 2Blk, and another color separation unit comprises another compensating filter 10Blk. Then, the color separation units including the different compensating filters 2Blk, 10Blk may be provided on the incident plane in a combined state.

In the above-mentioned first embodiment and the above-mentioned third embodiment, the sizes of the areas of the spectral filters 2G, 2B, 2R, and the compensating filters 2Blk, 10Blk are the same. However, the sizes of the areas of the spectral filters 2G, 2B, 2R, and the compensating filters 2blk, 10Blk can be changed freely in terms of maintaining the necessary sensitivity ratio.

For example, in order to match the sensitivity ratio with a common Bayer ratio, as shown in FIG. 12, the area ratio of the spectral filter 2G, the spectral filter 2B, the spectral filter 2R and the compensating filter 2Blk may be 4:2:2:1 in the color separation unit.

In the same manner, the area ratio of the spectral filter 2G, the spectral filter 2B, the spectral filter 2R and the compensating filter 10Blk may be 4:2:2:1 in the color separation unit.

Moreover, in accordance with this ratio, the area ratio of a light receiving element 3G, a light receiving element 3B, a light receiving element 3R and a compensating light receiving element 3Blk may be 4:2:2:1.

In this case, the image sensor can be utilized efficiently with little change of an existing image processing software (image engine).

Fifth Embodiment

In this embodiment, a modified embodiment of the above-mentioned first to fourth embodiments will be explained. In this embodiment, a modified embodiment of the image sensor 9 according to the above-mentioned third embodiment will be explained specifically. However, the image sensor 1 according to the above-mentioned first embodiment and the image sensor according to the second or fourth embodiment can also be modified in the same manner.

FIG. 13 is a diagram showing an example of a cross section of an image sensor according to this embodiment.

This image sensor 12 has a transfer lenses 13 disposed on the light incident side of a filter layer 11 instead of the resin layer 7 and the micro lenses 8 of the image sensor 9 according to the above-mentioned third embodiment. These transfer lenses 13 realize the same function as that of the micro lenses.

Like the resin layer 7 according to the above-mentioned third embodiment, the transfer lenses 13 have the characteristic of restraining the transmittance in the wavelength range including the 780 nm wavelength in the infrared range (transmittance adjusting function). The transfer lenses 13 are disposed so as to be paired with each spectral filter 2G, 2B, 2R and the compensating filter 2Blk.

As an example of a production process for the image sensor 12, first by the same process as in the above-mentioned third embodiment, light receiving elements 3G, 3B, 3R, 3Blk are disposed on a semiconductor substrate 4, a flattening layer 5, the filter layer 11, the resin layer 7 are laminated, and the micro lenses 8 are provided.

Next, with the micro lenses 8 provided as the matrix (mask), anisotropic etching is carried out to the incident side of the image sensor 12 by a method of dry etching.

Thereby, the shape of the micro lenses 8 is transferred to the resin layer 7 so that the transfer lenses 13 are formed on the incident side of the filter layer 11.

In this embodiment, the transfer lenses 13 have the same transmittance as that of the resin layer 7 according to the above-mentioned third embodiment. Therefore, the same color separation as that of the above-mentioned second embodiment is realized by the image sensor 12.

Moreover, the distances between the transfer lenses 13 and the light receiving elements 3G, 3B, 3R, 3Blk are shorter than the distances between the micro lenses 8 and the light receiving elements 3G, 3B, 3R, 3Blk in the above-mentioned third embodiment.

Therefore, according to the image sensor 12 of this embodiment, a light taking angle can be expanded so that the color performing properties can be improved as well as the bright observation results can be obtained.

In the above-mentioned embodiments, the thickness of the compensating filter 2Blk, 10Blk portion in the filter layers 6, 11 may be thicker than the thickness of the other spectral filter 2G, 2B, 2R portion so as to produce grade differences.

In order to eliminate the grade differences, dent portions (counter bores) may be formed in the flattening layer 5 in the shape of the compensating filters 2Blk, 10Blk so as to dispose another dent portions generated by the compensating filters 2Blk, 10Blk in the filter layers 6, 11 in this dent portions. For formation of the dent portions of the flattening layer 5, dry etching may be used.

Sixth Embodiment

In this embodiment, an image sensor comprising the compensating filter 2Blk explained in the above-mentioned first embodiment or the compensating filter 10Blk explained in the above-mentioned third embodiment and used as an infrared ray sensor will be explained.

Figure 14:
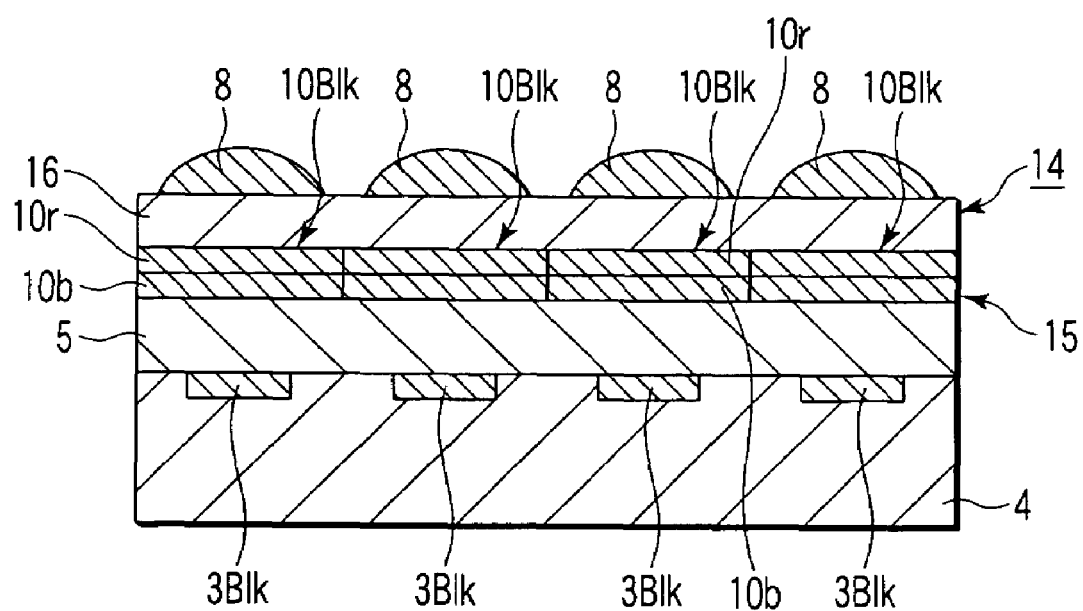
FIG. 14 is a diagram showing an example of a cross section of an image sensor according to the sixth embodiment of the present invention.

FIG. 14 is a diagram showing an example of a cross section of the image sensor according to this embodiment.

In an image sensor 14, a light receiving element 3Blk is disposed on a semiconductor substrate 4, a flattening layer 5, a filter layer 15 provided with only a plurality of compensating filters 10Blk and a resin layer 16 are laminated, and a micro lenses 8 are disposed. For the resin layer 16, a transparent resin without the transmission restraining characteristic can be used.

The image sensor 14 according to this embodiment has a transmission restraining characteristic in the visible light wavelength range and a transmission characteristic in the infrared range. Therefore, the image sensor 14 can be used as a preferable infrared ray sensor for transmitting a long wavelength light of for example 800 nm or more.

In this embodiment, although the compensating filter 10Blk is used, the compensating filter 2Blk may be used as well. Moreover, transfer lenses 13 may be disposed on the light incident side of the filter layer 15.

In the above-mentioned embodiments, although the compensating filters 2Blk, 10Blk have a two layer structure, a spectral filter with a plurality of dyes or organic pigments having the transmission range in the visible light wavelength range mixed may be used as well. Moreover, the compensating filters 2Blk, 10Blk may have a structure with three or more layers of the spectral filters 2G, 2B, 2R with respect to various colors such as green, blue and red superimposed.

More specifically, the compensating filters 2Blk, 10Blk may be formed by optical superimposition of two or more colors.

In the above-mentioned embodiments, the constituent elements may be changed freely as long as the same operation can be realized so that the arrangement may be changed so as to be combined freely or divided.

In the above-mentioned embodiments, the transmission characteristic meaning the high transmission state for the compensating filters 2Blk, 10Blk, or the like may denote for example a 65% or more transmittance because the transmittance of a spectral filter by the glass reference is 65 to 70% for those having a low transmittance. However, it is preferable that the transmission characteristic denote a 90% or more transmittance because a transparent resin can realize a transmittance of about 90% to 100%.

On the other hand, in the above-mentioned embodiments, the transmission restraining characteristic meaning a low transmission state for the compensating filters 2Blk, 10Blk, or the like may denote for example a 15% or less transmittance because a lifted portion of a green spectral filter 2G, or the like has a transmittance of about 15% or less.

It is preferable that the transmission restraining characteristic of the compensating filters 2Blk, 10Blk denote a transmittance as low as possible, such as 10% or less, or 1% or less.

Seventh Embodiment

In this embodiment, an image sensor for observing the incident light using a complementary color system spectral filter and a complementary color system compensating filter will be explained.

Figure 15:
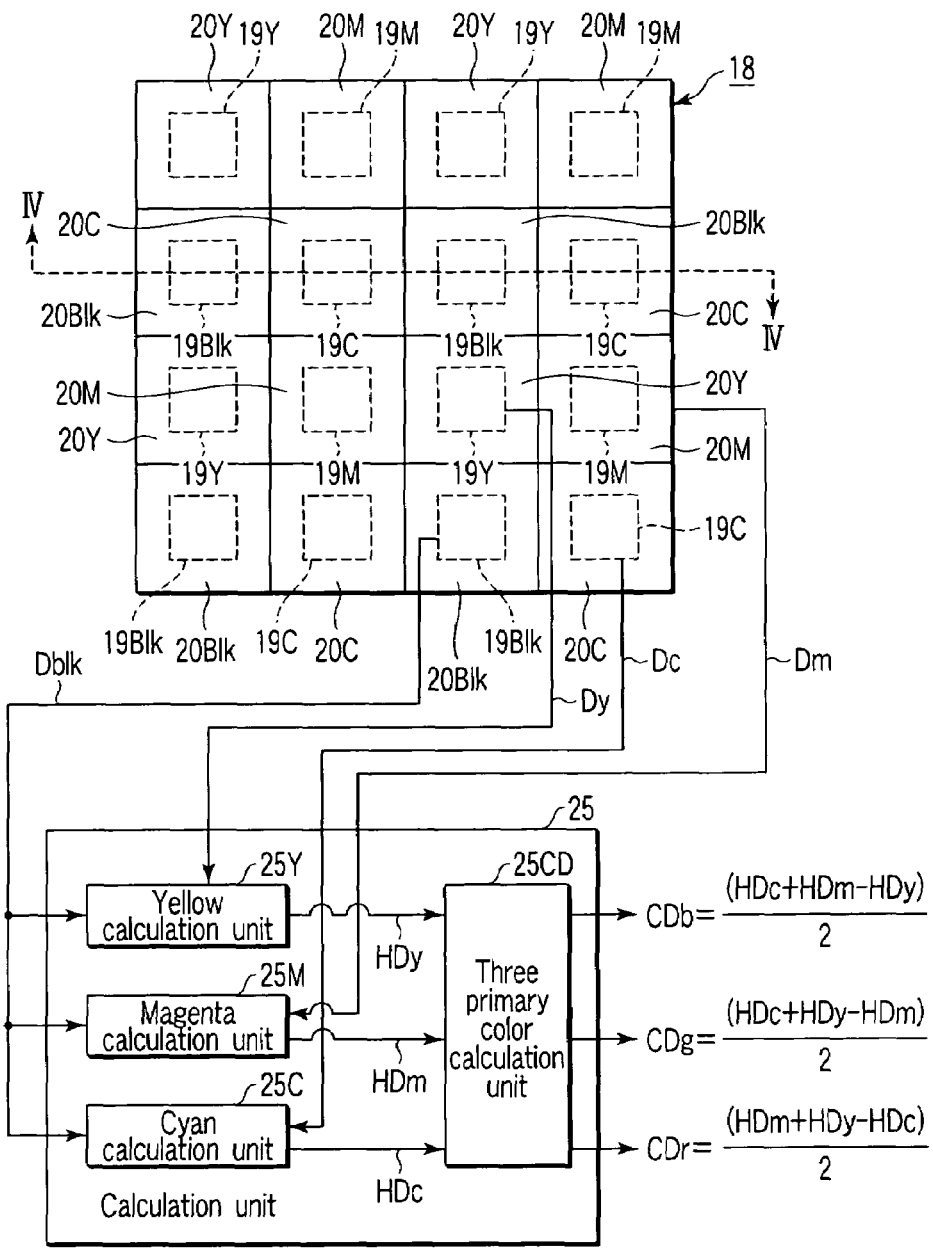
FIG. 15 is a front view showing an example of a filter arrangement state in an image sensor according to the seventh embodiment of the present invention.

FIG. 15 is a front view showing an example of a filter arrangement state in the image sensor according to this embodiment. FIG. 15 shows an example of a filter state viewed from the light incident side.

Figure 16:
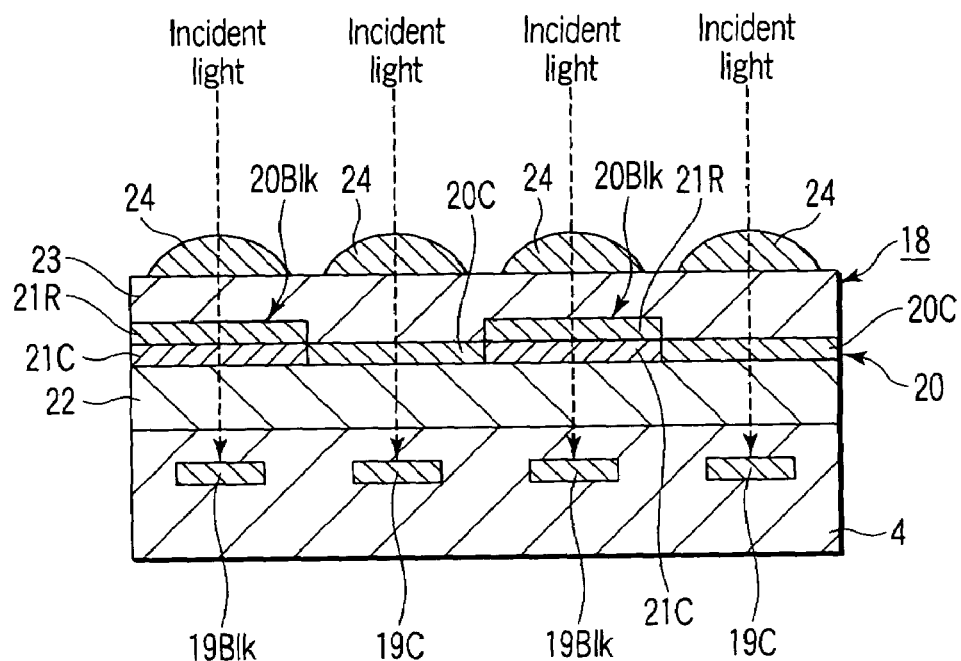
FIG. 16 is a cross-sectional view showing an example of the image sensor according to the seventh embodiment.

FIG. 16 is a cross-sectional view showing an example of the image sensor according to this embodiment. FIG. 16 shows the cross section taken along a line IV-IV of FIG. 15. Although FIG. 16 shows a case where the light receiving elements are CMOSs, the same applies to a case where the light receiving elements are CCDs.

An image sensor 18 according to this embodiment comprises light receiving elements 19Y, 19M, 19C and a compensating light receiving element 19Blk, spectral filters 20Y, 20M, 20C and a compensating filter 20Blk to be paired with the light receiving elements 19Y, 19M, 19C and the compensating light receiving element 19Blk, and a calculation unit 25.

Each one of the yellow filter 20Y, the magenta filter 20M, the cyan filter 20Y and the compensating filter 20Blk form one unit of a color separation. The yellow filter 20Y, the magenta filter 20M, the cyan filter 20C and the compensating filter 20Blk are disposed adjacently in a rectangular arrangement so as to form a plane.

The yellow filter 20Y, the magenta filter 20M and the cyan filter 20C are complementary color filters. In general, since the complementary color filters have a higher light transmittance than that of the three primary color filters of red, green and blue, the highly accurate observation can be enabled.

The yellow filter 20Y is a yellow color filter used for an extraction of a yellow component out of the incident light.

The magenta filter 20$m$ is a magenta color filter used for an extraction of a magenta component out of the incident light.

The cyan filter 20C is a cyan color filter used for an extraction of a cyan component out of the incident light.

The compensating filter 20Blk is a filter having a transmission restraining characteristic in the visible light wavelength range and a transmission restraining characteristic on the longer wavelength out of the visible light wavelength range, and it has a characteristic with a transmittance in the infrared range higher than a transmittance in the visible light wavelength range. Since the compensating filter 20Blk has the transmission restraining characteristic (low transmission characteristic) in the visible light wavelength range, it looks black visually.

The compensating filter 20Blk is formed by optically superimposing cyan and red. In order to realize the optical superimposition, in this embodiment, a cyan filter 21C and a red filter 21R are laminated, a filter having a cyan coloring material and a red coloring material mixed may be used as well.

The yellow filter 20Y, the magenta filer 20M, the cyan filter 20C and the compensating filter 20Blk form a filter layer 20.

The yellow light receiving element 19Y, the magenta light receiving element 19M, the cyan light receiving element 19M and the compensating light receiving element 19Blk as the light receiving elements are disposed each on the opposite side of the light incident side of the yellow filter 20Y, the magenta filter 20M, the cyan filter 20C and the compensating filter 20Blk, respectively, so as to convert a received light into electric signals for obtaining the observation data values.

The yellow light receiving element 19Y corresponds to the yellow filter 20Y and observes the incident light via the yellow filter 20Y.

The magenta light receiving element 19M corresponds to the magenta filter 20M and observes the incident light via the magenta filter 20M.

The cyan light receiving element 19C corresponds to the cyan filter 20C and observes the incident light via the cyan filter 20C.

The compensating light receiving element 19Blk corresponds to the compensating filter 20Blk and observes the incident light via the compensating filter 20Blk.

A combination of the light receiving element and the filter one by one corresponds to a pixel.

In this embodiment, a flattening layer 22 is formed between a semiconductor substrate 4 and the filter layer 20.

Moreover, a resin layer 23, and a micro lenses 24 are formed on the light incident side of the filter layer 20.

At least one of the flattening layer 22, the filter layer 20, the resin layer 23 and the micro lenses 24 has a function of restraining a transmittance of the incident light in the infrared range on the boundary region with the visible light wavelength range.

Therefore, for example, an infrared ray absorbing agent for absorbing an infrared ray of the 700 nm to 800 nm wavelength in the infrared range is added to at least one of the flattening layer 22, the filter layer 20, the resin layer 23 and the micro lenses 24.

In order to realize the function of absorbing the infrared ray of the 700 nm to 800 nm wavelength, for example, at least one of the flattening layer 22, the filter layer 20, the resin layer 23 and the micro lenses 24 absorbs a light of a 700 nm to 800 nm wavelength so as to provide a transmission restraining characteristic between the 700 nm to 800 nm wavelength.

The calculation unit 25 comprises a yellow calculation unit 25Y, a magenta calculation unit 25M, a cyan calculation unit 25C, and a three primary color calculation unit 25CD. The calculation unit 25 has a function of calculating compensated observation data values HDy, HDm, HDc based on the observation data values Dy, Dm, Dc, Dblk by the yellow light receiving element 19Y, the magenta light receiving element 19M, the cyan light receiving element 19C and the compensating light receiving element 19Blk, and furthermore, calculating a blue observation data value CDb, green observation data value CDg and red observation data value CDr based on the compensated observation data values HDy, HDm, HDc.

The yellow calculation unit 25Y subtracts the observation data value Dblk observed by the compensating light receiving element 19Blk from the observation data value Dy observed by the yellow light receiving element 19Y for calculating the compensated yellow observation data value HDy (=Dy−Dblk).

The magenta calculation unit 25Y subtracts the observation data value Dblk observed by the compensating light receiving element 19Blk from the observation data value Dm observed by the magenta light receiving element 19M for calculating the compensated magenta observation data value HDm (=Dm−Dblk).

The cyan calculation unit 25C subtracts the observation data value Dblk observed by the compensating light receiving element 19Blk from the observation data value Dc observed by the cyan light receiving element 19C for calculating the compensated cyan observation data value HDc (=Dc−Dblk).

The three primary color calculation unit 25CD calculates a blue observation data value CDb, a green observation data value CDg, and a red observation data value CDr as the three primary colors of a light based on the compensated yellow observation data value HDy, the compensated magenta observation data value HDm and the compensated cyan observation data value HDc.

Specifically, the three primary color calculation unit 25CD calculates CDb=(HDc+HDm−HDy)/2, CDg=(HDc+HDy−HDm)/2 and CDr=(HDm+HDy−HDc)/2. In general, the relationships cyan=blue+green, magenta=blue+red, and yellow=green+red are satisfied.

Hereinafter, a production process for the image sensor 18 according to this embodiment will be explained.

In the semiconductor substrate 4, the yellow light receiving element 19Y, the magenta light receiving element 19M, the cyan light receiving element 19C and the compensating light receiving element 19Blk are formed and provided.

The flattening layer 22 is laminated on the light incident side surface of the semiconductor substrate 4 with the yellow light receiving element 19Y, the magenta light receiving element 19M, the cyan light receiving element 19C and the compensating light receiving element 19Blk formed thereon. Thereby, the surface to install the cyan filter 20C, the yellow filter 20Y, the magenta filter 20M and the compensating filter 20Blk can be flattened.

The cyan filter 20C, the yellow filter 20Y, the magenta filter 20M and the compensating filter 20Blk each corresponding to the cyan light receiving element 19C, the yellow light receiving element 19Y, the magenta light receiving element 19M and the compensating light receiving element 19Blk are disposed in this order on the light incident side surface of the flattening layer 22 so as to form the filter layer 20.

The resin layer (transparent smoothing layer) 23 is laminated on the light incident side of the filter layer 20.

The micro lenses 24 corresponding to the yellow light receiving element 19Y, the magenta light receiving element 19M, the cyan light receiving element 19C and the compensating light receiving element 19Blk are provided on the light incident side of the resin layer 23. The micro lenses 24 are disposed each on the yellow filter 20Y, the magenta filter 20M, the cyan filter 20C and the compensating filter 20Blk so as to be paired with each of the yellow filter 20Y, the magenta filter 20M, the cyan filter 20C and the compensating filter 20Blk. The micro lenses 24 are formed with an acrylic resin, or the like for improving light collecting properties of the incident light with respect to the yellow light receiving element 19Y, the magenta light receiving element 19M, the cyan light receiving element 19C and the compensating light receiving element 19Blk.

As mentioned above, in FIG. 16, the compensating light receiving element 19Blk having a laminated structure of the cyan filter 21C and the red filter 21R is used.

Figure 17:
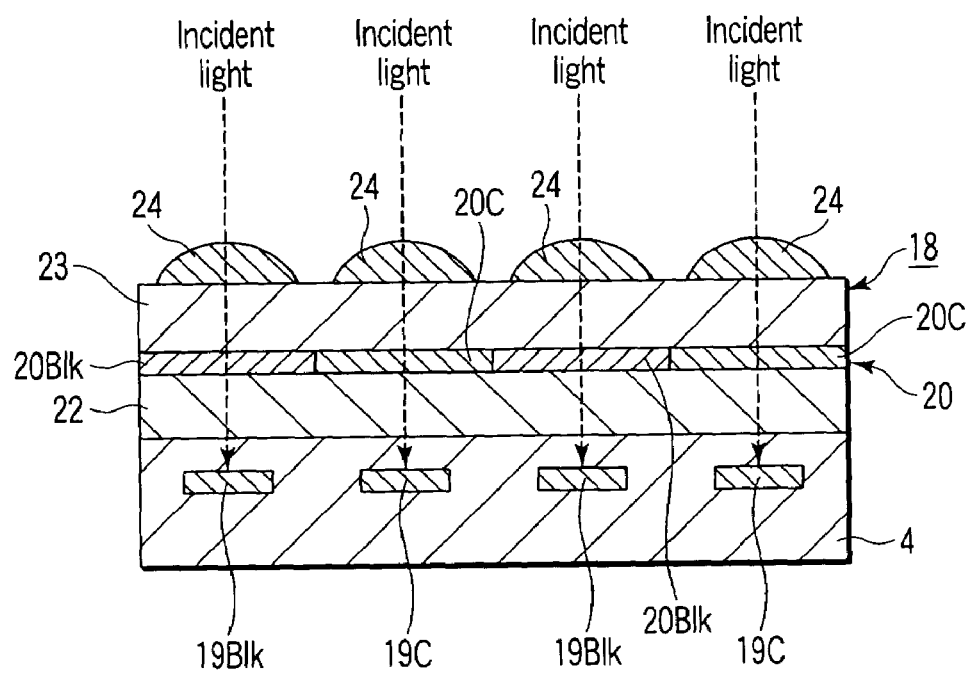
FIG. 17 is a cross-sectional view showing an example of the image sensor comprising a compensating filter having a single layer structure.

However, the compensating filter 2Blk is not limited to the structure shown in FIG. 16 as long as it is realized by an optical superimposition. The optical superimposition here may be realized also by a laminated structure of color filters of two or more different colors as shown in FIG. 16 or it may be realized by a single layer of a colored resin with coloring materials (such as a pigment or a coloring matter) mixed for providing color filters of a plurality of different colors as shown in FIG. 17. Moreover, for an adjustment of the color or an adjustment of a transmittance, two or more coloring materials may be used.

By optically superimposing the color filters of two or more colors accordingly, the transmittance of the compensating filter 20Blk is the product of the transmittances of each color filter to be superimposed. Therefore, by forming the compensating filter 20Blk by the optical superimposition as in this embodiment, the compensating filter 20Blk having the transmission restraining characteristic in the visible light wavelength range and the transmission characteristic on the longer wavelength out of the visible light wavelength range can be produced.

In this embodiment, a thickness of a filter single layer was each 0.7 μm, and a pixel pitch (pitch of the yellow filter 20Y, the magenta filter 20M, the cyan filter 20C and the compensating filter 20Blk) is 2.6 μm.

an average thickness of the flattening layer 22 is 0.1 μm. In this embodiment, although the flattening layer 22 is formed, the flattening layer 22 may be omitted for the purpose of making the image sensor further thinner.

Hereinafter, the transmittance characteristic will be explained.

Figure 18:
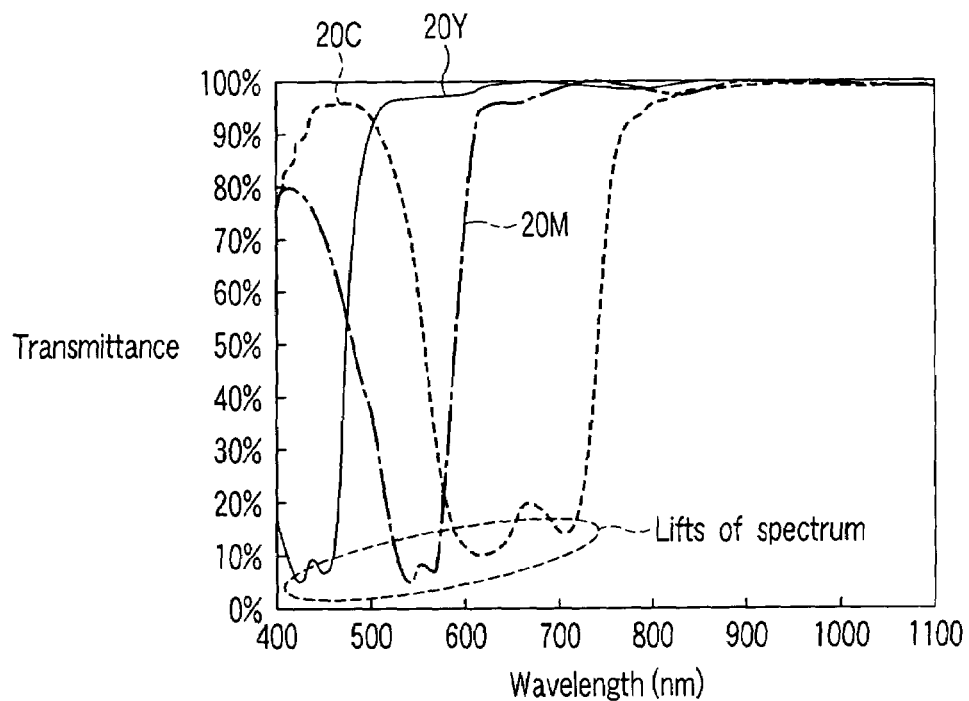
FIG. 18 is a graph showing an example of spectral transmittances of a yellow filter, a magenta filter and a cyan filter.

FIG. 18 is a graph showing an example of the spectral transmittance of the yellow filter 20Y, the magenta filter 20M and the cyan filter 20C. In FIG. 18, an example of relationships between the light wavelength 400 nm to 1,100 nm and the transmittances are shown in the graph.

As shown in FIG. 18, according to the spectral transmittances of the yellow filter 20Y, the magenta filter 20M and the cyan filter 20C, although the transmittances are low at skirt parts of spectral curves (transmittance restrained parts), the incident light is transmitted by about several %. Such values of the transmittances remaining at the skirt parts of the spectral curves are referred to as lifts of the spectrum.

The lifts of the spectrum causes a noise in the color separation carried out based on the observation data values Dy, Dm, Dc by the yellow light receiving element 19Y, the magenta light receiving element 19M and the cyan light receiving element 19C so as to lower color reproduction properties and cause the image quality deterioration.

Moreover, since the yellow filter 20Y, the magenta filter 20M and the cyan filter 20C have a high transmittance in the infrared range, a problem is involved in that a light in the infrared range is also observed by the yellow light receiving element 19Y, the magenta light receiving element 19M and the cyan light receiving element 19C.

Figure 19:
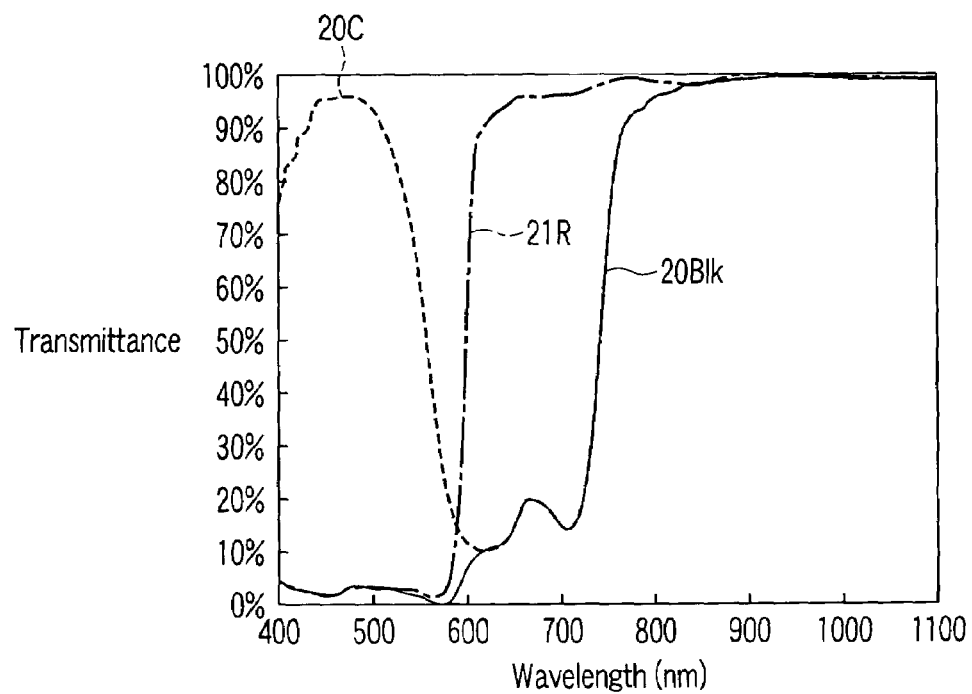
FIG. 19 is a graph showing an example of a spectral transmittance of a compensating filter according to the seventh embodiment.

FIG. 19 is a graph showing an example of a spectral transmittance of the compensating filter 20Blk according to this embodiment. In FIG. 19, an example of a relationship between a light wavelength and a transmittance is shown in the graph.

At each wavelength, a product value of the transmittance of the cyan filter 21C and the transmittance of the red filter 21R is the transmittance of the compensating filter 20Blk.

Figure 20:
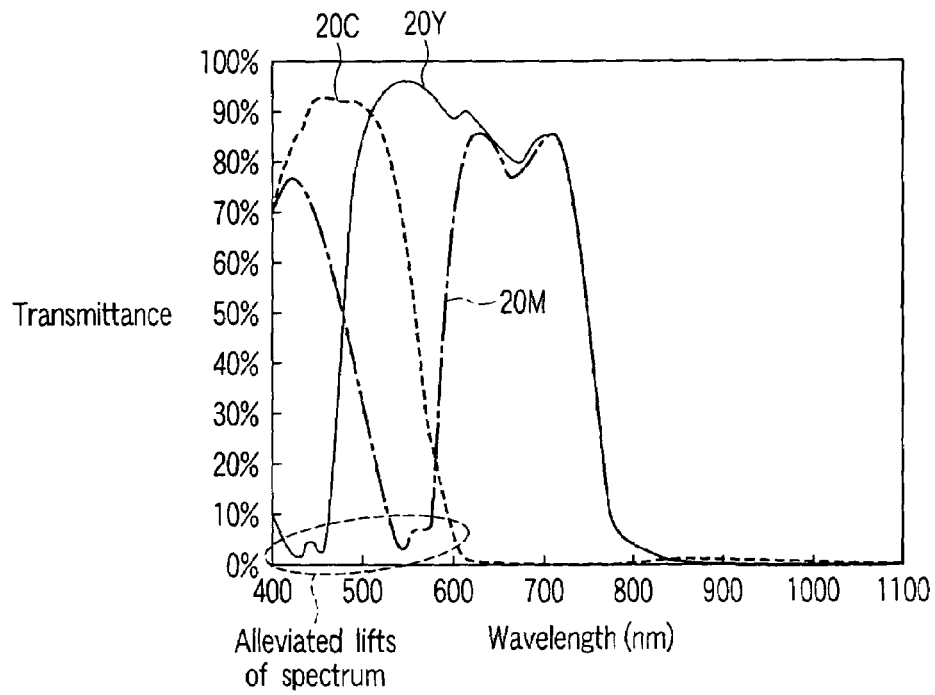
FIG. 20 is a graph showing an example of spectral transmittances of an image sensor according to the seventh embodiment.

FIG. 20 is a graph showing an example of spectral transmittances of the image sensor 18 according to this embodiment.

FIG. 20 shows an example of relationships between wavelengths and transmittances in the case of subtracting the integration value of the transmittance of the compensating filter 20Blk from the integration values of the transmittance of each of the yellow filter 20Y, the magenta filter 20M and the cyan filter 20C in the graph.

Accordingly, since the spectral characteristic of the compensating filter are subtracted from the yellow, magenta and cyan spectral characteristics in this embodiment, the spectral lifts are also subtracted so that the influences of the spectral lifts on the observation results can be alleviated.

By adjusting the combination of a plurality of the coloring materials for the compensating filter 20Blk, the spectral lifts can further be made smaller.

Then, since the spectral characteristic of the compensating filter is subtracted from the yellow, magenta and cyan spectral characteristics, the observation results in the infrared range are also subtracted so that the influence of the observation results in the infrared range can be alleviated.

FIG. 20 denotes that the infrared ray can be cut in the image sensor 18 on the longer wavelength out of 700 nm, in particular on the longer wavelength out of 800 nm.

The transmittance of the compensating filter 20Blk in the wavelength range of about 700 nm to 800 nm on the boundary region with the visible light wavelength range in the infrared range (boundary infrared range) can be adjusted by the combination of a plurality of the coloring materials.

Therefore, in this embodiment, the noise in the color separation can dramatically be reduced so as to improve the image quality.

Figure 21:
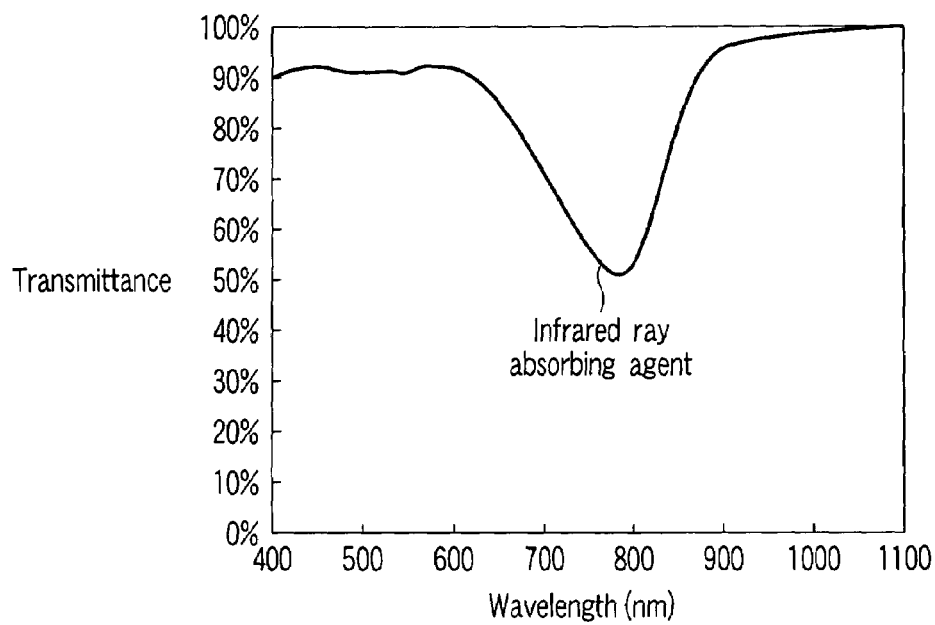
FIG. 21 is a graph showing an example of a spectral transmittance of an infrared ray absorbing agent used in the image sensor according to the seventh embodiment.

FIG. 21 is a graph showing an example of a spectral transmittance of an infrared ray absorbing agent used in the image sensor 18 according to this embodiment.

The infrared ray absorbing agent absorbs a light in the boundary infrared range. The infrared ray absorbing agent is added to at least one of the flattening layer 22, the filter layer 20, the resin layer 23, the micro lenses 24 and the filter layer 20. Thereby, influence of a light of the boundary infrared range on the observation results can be prevented. That is, the light observed by the yellow light receiving element 19Y, the magenta light receiving element 19M, the cyan light receiving element 19C and the compensating light receiving element 19Blk in the infrared range can further be restrained.

For absorbing a light in the boundary infrared range, a coloring material having the infrared ray absorbing characteristics may be dispersed and mixed in the image sensor, or a resin solution prepared by dissolving the same may be used for the image sensor.

Figure 22:
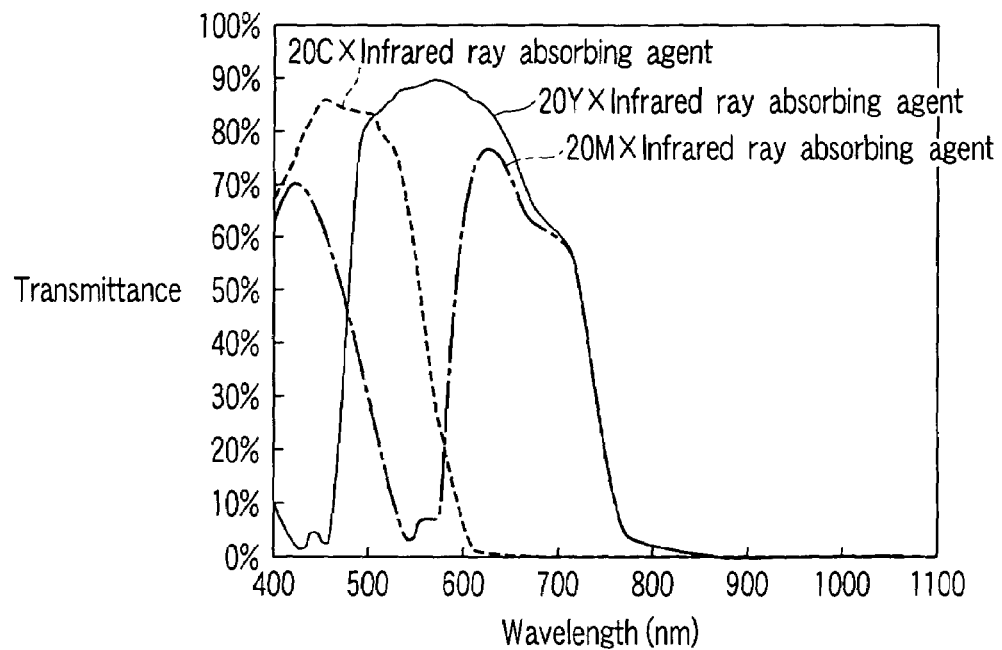
FIG. 22 is a graph showing an example of spectral characteristics of combining the spectral transmittances of the image sensor according to the seventh embodiment and the spectral transmittance of the infrared ray absorbing agent.

FIG. 22 is a graph showing an example of spectral characteristics of combining the spectral transmittances of the image sensor 18 according to this embodiment and the spectral transmittance of the infrared ray absorbing agent.

In FIG. 22, adjustment of the transmittance of yellow or magenta in the boundary infrared range may be realized by adding a coloring material of another color to the yellow filter 20Y or the magenta filter 20M, or a layer of a coloring material for absorbing a light in the boundary infrared range may be provided to the yellow filter 20Y or the magenta filter 20M.

Specifically, in this embodiment, for restraining the transmittance in the boundary infrared range including the light wavelength 780 nm, an organic pigment represented by a phthalocyanine based organic pigment may be added to a transparent resin for forming a coating layer. Moreover, an infrared ray absorbing material may be added to the material of the micro lenses 24.

Moreover, a layer including an infrared ray absorbing material may be laminated below or above the yellow filter 20Y, and the magenta filter 20M.

As the infrared ray absorbing agent, for example, an anthraquionone based compound, a phthalocyanine based compound, a cyanine based compound, a polymethylene based compound, an aluminum based compound, a diimonium based compound, an imonium based compound, an azo based compound, or the like can be used.

According to the image sensor 18 of this embodiment, an ultraviolet ray absorbing agent, or the like may be added to the light incident side of the yellow filter 20Y, the magenta filter 20M, the cyan filter 20C and the compensating filter 20Blk.

As the ultraviolet ray absorbing agent, a benzotriazol based compound, a benzophenone based compound, a salicylic acid based compound, a coumarin based compound, or the like can be used. Moreover, to the ultraviolet ray absorbing agent, for example, a light stabilizing agent such as a hindered min based compound, or a quencher may be added.

The infrared ray absorbing function of the image sensor 18 according to this embodiment may be realized by adding an infrared ray absorbing compound or an infrared ray absorbing agent to a transparent resin, or it may be realized by a pendant system for assembling an infrared ray absorbing compound or an infrared ray absorbing agent in a resin molecule chain by the form of a reaction type infrared ray absorbing agent such as a reactive dye.

Hereinafter, by comparing the conventional image sensor and the image sensor 18 according to this embodiment, the difference of the effects will be explained.

Recently, with the increase of the number of pixels of the image pickup elements, the pixels have become more minute so that the pixel pitch has become less than 3 μm so as to be 2 μm. With the pixel size in the vicinity of 2 μm, the light amount collected to a pixel is limited so that the sensitivity of the image sensor is lowered, thereby a dark image quality may be provided.

On the other hand, according to this embodiment, by the use of the yellow filter 20Y, the magenta filter 20M and the cyan filter 20C of the complementary color, a sensitivity decline of the image sensor 18 is prevented so as to improve an image quality.

In this embodiment, the spectral lifts in the complementary filters of yellow, magenta and cyan, and the spectral lifts in the primary color filters of red, green and blue can be eliminated by the subtraction of the observation data value Dblk of the compensating filter 20Blk. Since the spectral lifts to cause a noise at the time of the color separation is reduced, the color reproduction properties of the image sensor 18 can be improved so as to improve the image quality.

According to the image sensor 18 of this embodiment, the infrared ray cutting filter included in the conventional image sensor can be omitted so that a thinner shape can be achieved without the need of increasing the thickness of the lens optical system. That is, according to the conventional image sensor, an infrared ray cutting filter was inserted to the optical system of a camera module. On the other hand, according to the image sensor 18 of this embodiment, since the conventional infrared ray cutting filter can be eliminated, a thinner shape can be realized.

Moreover, according to the image sensor 18 of this embodiment, influence by a light in an infrared range on the observation results can be prevented since it is not necessary to change the basic configuration of the image sensor.

According to the conventional image sensor, an entire light incident plane is covered with the absorbing type infrared ray cutting filter. In this case, the spectral characteristics and a slight red color reproduction property of the individual pixel may be lowered.

On the other hand, according to the image sensor 18 of this embodiment, a red sensitivity can be raised so that a red color reproduction property can be improved.

The absorbing type infrared ray cutting filter included in the conventional image sensor tends to bring about sensitivity declines of yellow, magenta, red and green so that color performing properties may be lowered.

On the other hand, according to this embodiment, since the sensitivity declines in the wavelength range of about 400 nm to 700 nm in the visible light wavelength range are little, the color performing properties can be improved.

In this embodiment, for example, as the yellow pigment, C.I. Pigment yellow 150 can be used, as the cyan pigment, C.I. Pigment blue 15:3, as the magenta pigment, C.I. Pigment red 122, and as the red pigment, a mixture of C.I. Pigment red 177, C.I. Pigment red 48:1 and C.I. Pigment yellow 139 can be used, respectively.

For example, a resist solid ratio (acrylic based photosensitive resin and pigment, or the like) is in the range of about 15 to 35%, and the pigment ratio in the solid ratio is in the range of about 13% to 40%.

Eighth Embodiment

In this embodiment, a modified embodiment of the compensating filter 20Blk according to the above-mentioned seventh embodiment will be explained.

Figure 23:
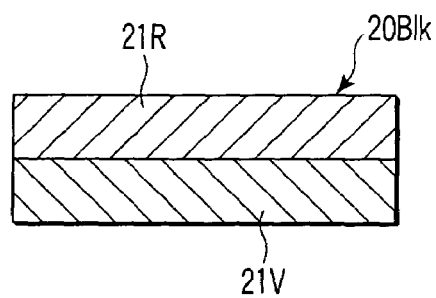
FIG. 23 is a diagram showing a first example of a cross section of a compensating filter according to the eighth embodiment of the present invention.

FIG. 23 is a diagram showing a first example of the cross section of a compensating filter 20Blk according to this embodiment.

In this embodiment, the compensating filter 20Blk is formed by a optical superimposition of violet and red.

In FIG. 23, the compensating filter 20Blk is formed by laminating a violet filter 21V and a red filter 21R.

The compensating filter 20Blk may be formed as a single layer with a mixture of the violet and red coloring materials.

FIG. 24 is a graph showing an example of the spectral characteristics of the violet filter 21V.

FIG. 25 is a graph showing a spectral characteristic of the compensating filter 20Blk formed by an optical superimposition of violet and red according to this embodiment.

FIG. 25 shows a relationship between a transmittance and a wavelength of the compensating filter 20Blk formed with a 1.1 μm layer thickness acrylic resin layer with the violet pigment and the red pigment mixed and dispersed.

Unlike an infrared ray cutting operation by the common absorbing type infrared ray cutting filter shown in FIG. 35, according to an infrared ray cutting operation by the calculation using the compensating filter 20Blk according to this embodiment, since the light absorption (effective absorption) in the wavelength range in the vicinity of about 600 nm to 650 nm is little, the red color performing property can be improved.

In this embodiment, as the violet pigment, C.I. Pigment violet 23 can be utilized.

Ninth Embodiment

In this embodiment, a modified example of the filter layer of the image sensor according to the above-mentioned seventh embodiment will be explained.

FIG. 26 is a diagram showing an example of a cross section of an image sensor according to this embodiment.

Although an image sensor 26 has a configuration of the filter layer different from that of the image sensor 18 of the above-mentioned seventh embodiment, the other portions are the same.

According to the filter layer 20 of the image sensor 18 of the above-mentioned seventh embodiment, the cyan filter 20C and the cyan filter 21C are provided independently.

On the other hand, a filter layer 27 of the image sensor 26 according to this embodiment comprises a cyan filter 27C with the above-mentioned cyan filter 20C and cyan filter 21C provided integrally.

Then, the laminated portion of the cyan filter 27C and the red filter 21R is disposed on the light incident side of a compensating light receiving element 19Blk. That is, in this embodiment, the compensating filter is the laminated portion of the cyan filter 27c and the red filter 21R out of the filter layer 27.

According to the configuration, the same effect as in the above-mentioned seventh embodiment can be obtained.

Tenth Embodiment

In this embodiment, a modified embodiment of the image sensor according to the above-mentioned ninth embodiment will be explained.

According to an image sensor according to this embodiment, the resin layer 23 and the micro lenses 24 in the image sensor 26 according to the above-mentioned ninth embodiment are provided integrally.

FIG. 27 is a cross-sectional view showing an example of the image sensor according to this embodiment.

An image sensor 28 according to this embodiment comprises transfer lenses 29 with the resin layer 23 and the micro lenses 24 of the image sensor 26 according to the above-mentioned ninth embodiment provided integrally. The transfer lenses 29 have functions of improving light collecting properties of the incident light with respect to a yellow light receiving element 19Y, a magenta light receiving element 19M, a cyan light receiving element 19C and a compensating light receiving element 19Blk.

The other portions of the image sensor 28 are the same as those of the image sensor 26 according to the above-mentioned ninth embodiment.

Hereinafter, a production process of the image sensor 28 will be explained.

Figure 28:
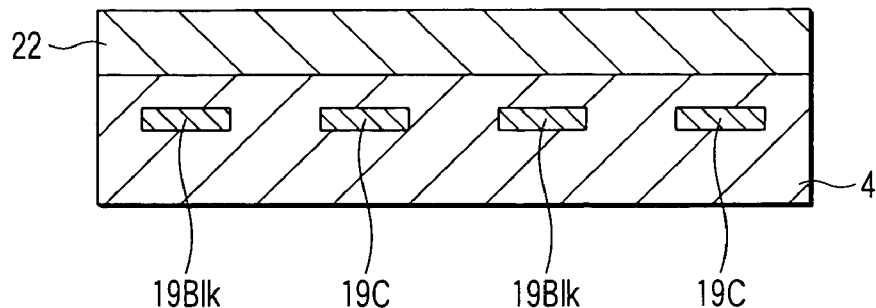
FIG. 28 is a cross-sectional view showing an example of the first step of a production process for the image sensor according to the tenth embodiment.

FIG. 28 is a cross-sectional view showing an example of a first step of the production process for the image sensor 28 according to this embodiment. Although in FIGS. 28 to 32, a case where the light receiving elements are CMOSs is shown, the same applies to a case where the light receiving element are CCDs.

First, the yellow light receiving element 19Y, the magenta light receiving element 19M, the cyan light receiving element 19C and the compensating light receiving element 19Blk are formed on a semiconductor substrate 4, and a flattening layer 22 as a transparent resin is coated and formed.

Since an ultraviolet ray is used for the pattern exposure to a photosensitive resin in forming the color filter comprising a photosensitive resin using a photolithography method, for preventing a halation at the time of the pattern exposure, an ultraviolet ray absorbing agent may be added to the flattening layer 22.

Figure 29:
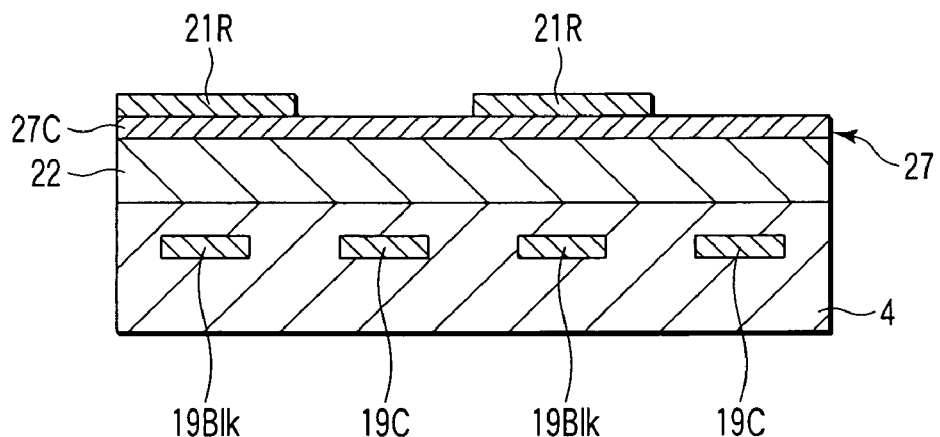
FIG. 29 is a cross-sectional view showing an example of a second step of the production process of the image sensor according to the tenth embodiment.

FIG. 29 is a cross-sectional view showing an example of a second step of the production process of the image sensor 28.

A cyan filter 27C, a yellow filter 27Y and a magenta filter 27M are formed in this order on the flattening layer 22 by the photolithography method, and thereafter a red filter 21R is formed for forming the compensating filter.

Figure 30:
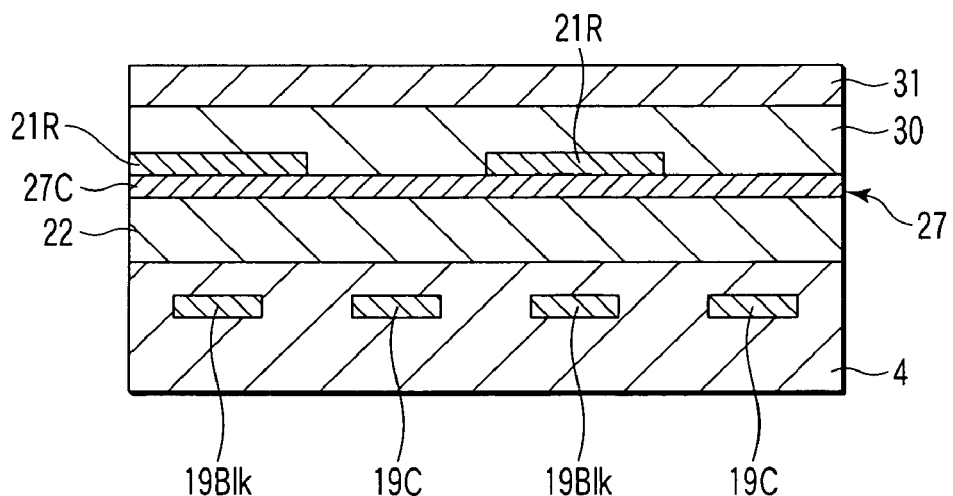
FIG. 30 is a cross-sectional view showing an example of the third step of the production process for the image sensor according to the tenth embodiment.

FIG. 30 is a cross-sectional view showing an example of a third step of the production process for the image sensor 28.

A resin layer 30 having a flattening function is formed on the semiconductor substrate 4 with a filter layer 27 formed thereon.

Furthermore, a photosensitive phenol resin 31 having the thermal flow property (fluidized by a heat process so as to be round), to be alkaline developed is coated on the resin layer 30.

Figure 31:
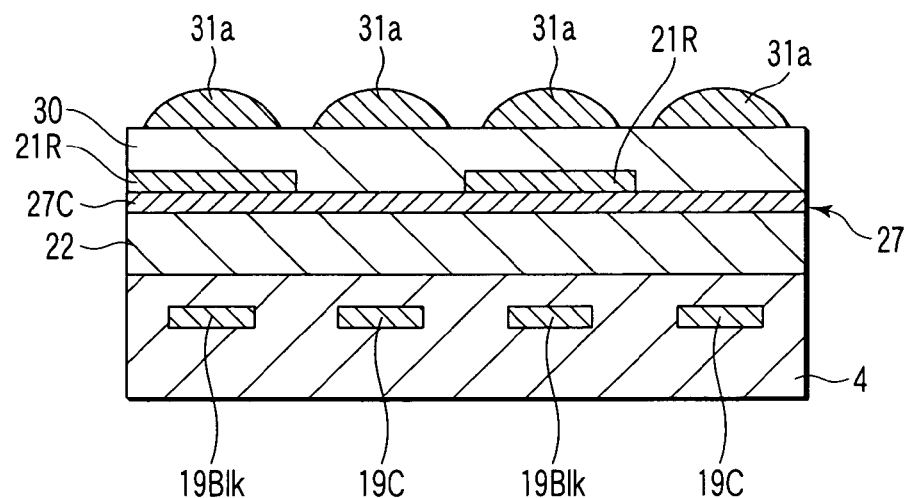
FIG. 31 is a cross-sectional view showing an example of the fourth step of the production process for the image sensor according to the tenth embodiment.

FIG. 31 is a cross-sectional view showing an example of a fourth step of the production process for the image sensor 28.

The photosensitive phenol resin 31 is shaped in a predetermined pattern (for example, a rectangular pattern) using the photolithography method.

Then, by heating at 200 degrees, the photosensitive phenol resin 31 in a predetermined pattern is fluidized so as to form a hemispheric lens matrix 31a.

Figure 32:
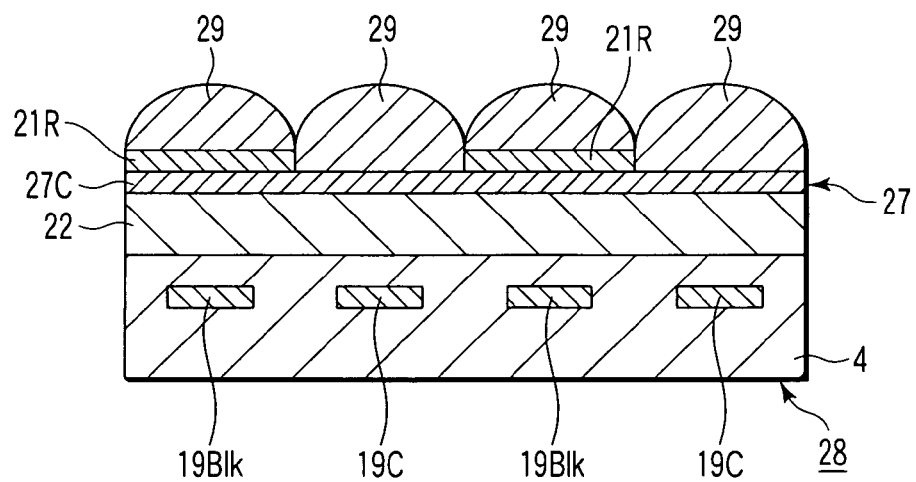
FIG. 32 is a cross-sectional view showing an example of the fifth step of the production process for the image sensor according to the tenth embodiment.

FIG. 32 is a cross-sectional view showing an example of a fifth step of the production process for an image sensor 11.

Anisotropic etching is carried out for the resin layer 30 in a dry etching device. According to the etching operation, although the lens matrix 31a is eliminated, with the lens matrix 31a serving as a mask to the resin layer 30, the hemispheric shape of the lens matrix 31a is transferred to the resin layer 30.

Thereby, the image sensor 28 comprising the transfer lenses 29 can be obtained.

As heretofore explained, according to this embodiment, the transfer lenses 29 are formed on the incident light side surface of the filter layer 27. In this embodiment, the image sensor 28 can be made further thinner.

As mentioned above, it is preferable to add an ultraviolet ray absorbing agent to the flattening layer 22 for preventing the halation at the time of the pattern exposure to the photosensitive resin. Moreover, it is preferable to add an ultraviolet ray absorbing agent to the transfer lenses 29 for preventing the noise generation by the ultraviolet ray based on the sensitivity in the ultraviolet ray range of the light receiving element.

As the ultraviolet ray absorbing agent, fine particles of a metal oxide, such as a cerium oxide or a titanium oxide can be used. However, as mentioned above, in the case where the ultraviolet ray absorbing agent is not added to the transfer lenses 29, the inorganic material may become an optically foreign matter in the resin of the transfer lens so as to block the light. In this case, a black portion may be generated in an image obtained by the image sensor 28. Therefore, it is preferable to use a dye based ultraviolet ray absorbing agent. As the ultraviolet ray absorbing agent, benzotriazol based, benzophenone based, triadine based, salicylate based, coumarin based, xanthene based, methoxy cinnamic acid based organic compounds, or the like can be used.

In the case of providing the compensating filter in a one-layer structure with a plurality of coloring materials mixed, it is preferable to form the filter layer in the order of the cyan filter 20C, the yellow filter 20Y, the magenta filter 20M and the compensating filter.

Eleventh Embodiment

In this embodiment, an image sensor comprising a light blocking film for preventing input to the light receiving element of light other than the light to be incident on the light receiving element out of the incident light in the other region excluding the region to input the incident light into the light receiving element on the incident side of the incident light of the substrate will be explained.

Figure 33:
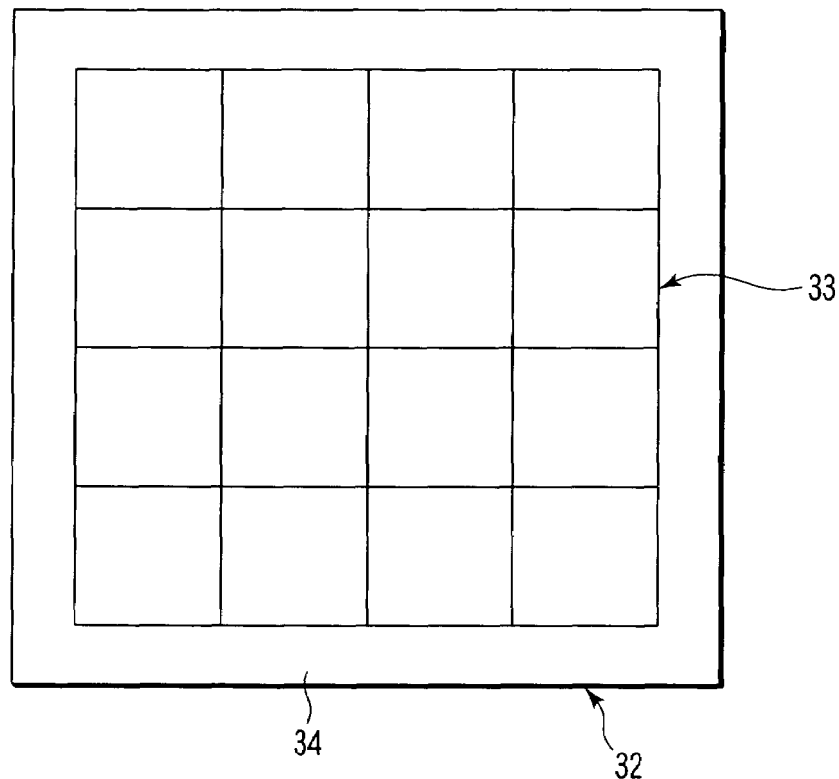
FIG. 33 is a front view showing the first example of an arrangement state of a light blocking layer included in an image sensor according to the eleventh embodiment of the present invention.

FIG. 33 is a front view showing a first example of an arrangement state of the light blocking film included in the image sensor according to this embodiment.

An image sensor 32 shown in FIG. 33 comprises a light blocking film 34 for restraining a light reflection on the outer circumferential part of an effective pixel part 33 with the spectral filter provided thereon, on the light incident side of the light receiving element.

For the light blocking film 34, the compensating filter explained for the above-mentioned embodiments can be used. That is, the light blocking film 34 can be formed by the same formation method as the above-mentioned various compensating filters with the same materials.

By installing the light blocking film 34 on the outer circumferential part of the effective pixel part 33 of the image sensor 32, an influence by the noise on an observation result of the image sensor 32 can be prevented so as to improve the image quality, and thus it is advantageous. In particular, by using the above-mentioned various compensating filters as the light blocking film 34, a light in the visible light wavelength range can be cut so as to reduce the stray light in the vicinity of the image sensor 32.

Figure 34:
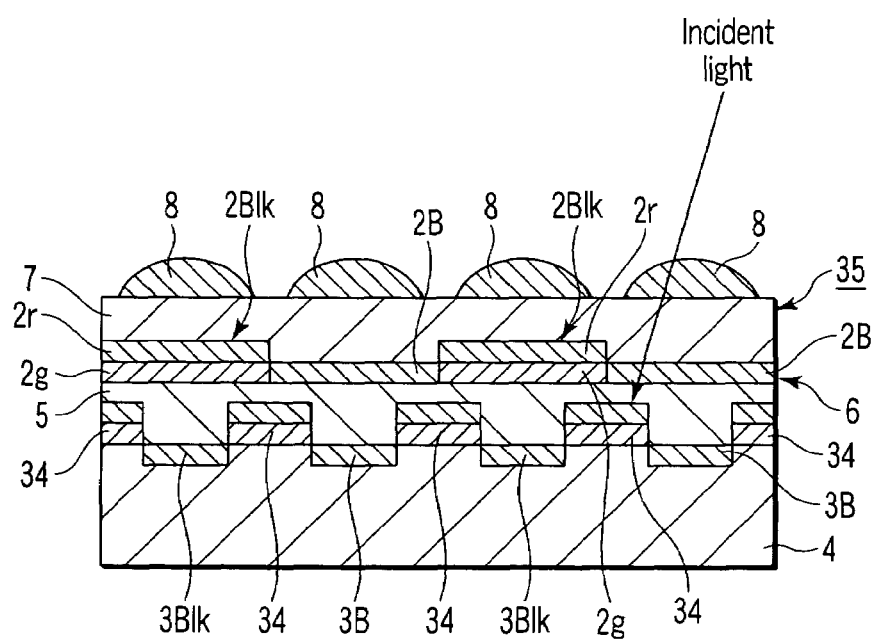
FIG. 34 is a front view showing the second example of an arrangement state of the light blocking layer included in the image sensor according to the eleventh embodiment.

FIG. 34 is a cross-sectional view showing a second example of an arrangement state of the light blocking film included in the image sensor according to this embodiment.

An image sensor 35 shown in FIG. 34 has the same configuration as that of the image sensor 1 according to the above-mentioned first embodiment, however, it has the light blocking film 34 provided in the region other than the region for taking a light to a red light receiving element 3R, a green light receiving element 3G, a blue light receiving element 3B and a compensating light receiving element 3Blk out of the light incident side surface of a semiconductor substrate 4.

The above-mentioned image sensor 35 comprise the light blocking film 34 having the transmission restraining characteristic in the visible light wavelength range in the region other than the opening region for taking the incident light by the light receiving element, on the light incident side of the semiconductor substrate 4.

According to the conventional image sensor, a light incident on a portion other than the light receiving element may be strayed so as to be a stray light. The stray light becomes a noise in the case where it is incident on the light receiving element thereafter. Moreover, in the case where an unnecessary light is incident on the circumferential portion of the image sensor or the circumferential portion of the light receiving element, the light causes a noise.

However, according to this embodiment, since the light blocking film 34 is provided, a light incident on the portion other than the light receiving element can be absorbed.

Thereby, input of a stray light and an unnecessary light to the light receiving element can be prevented so as to reduce the noise, thereby improving an image quality obtained by the image sensor 35. In particular, in the case where the compensating filter is used as the light blocking film 34, a light in the visible light wavelength range can be cut so as to reduce the stray light generated in the vicinity of the light receiving element, whereby the noise generation from the vicinity of the light receiving element can be alleviated.

The light blocking film 34 can be adopted not only to the above-mentioned first embodiment but also to the other embodiments.

In the case where the compensating filter is used as the light blocking film 34, a light in the infrared range and a light in the ultraviolet range transmit the light blocking film 34. Then, in this embodiment, with the light blocking film 34 disposed in the vicinity of the light receiving element of the semiconductor substrate 4, a film for absorbing the infrared ray and the ultraviolet ray may be laminated further on the light blocking film 34.

For example, a resin prepared by adding an infrared ray absorbing agent and an ultraviolet ray absorbing agent to a transparent resin used for formation of the micro lenses 8 is used as the film for absorbing the infrared ray and the ultraviolet ray, thereby the material cost can be reduced.

Thereby, noise generation by the infrared ray and the ultraviolet ray incident on the portion other than the light receiving element and strayed to be a stray light can be prevented.

The present invention can be utilized in a field of an image sensor comprising a light receiving element.

What is claimed is:

1. An image sensor comprising:
   a filter used for an extraction of a specific color component of an incident light: a light receiving element which observes the incident light via the filter: a compensating filter having a transmission restraining characteristic in a visible light wavelength range and a transmission characteristic in a wavelength range on a longer wavelength out of the visible light wavelength range: and a compensating light receiving element which observes the incident light via the compensating filter for compensating an observation result by the light receiving element,
   wherein the filter comprises:
   a yellow filter used for an extraction of a yellow component:
   a magenta filter used for an extraction of a magenta component: and
   a cyan filter used for an extraction of a cyan component, the light receiving element comprises:
   a yellow light receiving element which observes the incident light via the yellow filter:
   a magenta light receiving element which observes the incident light via the magenta filter; and
   a cyan light receiving element which observes the incident light via the cyan filter, the compensating filter is formed by optically superimposing a cyan component and a red component, and
   the image sensor further comprises:
   a yellow calculation unit which calculates a compensated yellow observation data value by subtracting an observation data value observed by the compensating light receiving element from an observation data value observed by the yellow light receiving element;
   a magenta calculation unit which calculates a compensated magenta observation data value by subtracting an observation data value observed by the compensating light receiving element from an observation data value observed by the magenta light receiving element;
   a cyan calculation unit which calculates a compensated cyan observation data value by subtracting an observation data value observed by the compensating light receiving element from an observation data value observed by the cyan light receiving element; and
   a three primary color calculation unit which calculates a blue observation data value, a green observation data value and a red observation data value as the three primary colors of a light based on the compensated yellow observation data value, the compensated magenta observation data value and the compensated cyan observation data value.

2. The image sensor according to claim 1, wherein the yellow filter, the magenta filter, the cyan filter, and the correcting filter are disposed in a rectangular arrangement so as to form a plane for forming a unit of a color separation.

3. An image sensor comprising:
   a filter used for an extraction of a specific color component of an incident light:
   a light receiving element which observes the incident light via the filter:
   a compensating filter having a transmission restraining characteristic in a visible light wavelength range and a transmission characteristic in a wavelength range on a longer wavelength out of the visible light wavelength range; and
   a compensating light receiving element which observes the incident light via the compensating filter for compensating an observation result by the light receiving element
   wherein the filter comprises:
   a yellow filter used for an extraction of a yellow component:
   a magenta filter used for an extraction of a magenta component; and
   a cyan filter used for an extraction of a cyan component
   the light receiving element comprises:
   a yellow light receiving element which observes the incident light via the yellow filter;
   a magenta light receiving element which observes the incident light via the magenta filter; and
   a cyan light receiving element which observes the incident light via the cyan filter
   the compensating filter is formed by optically superimposing a cyan component and a red component, and
   the image sensor further comprises lenses which are disposed on a light incident region of the filter and the compensating filter, and which restrain a transmittance in an infrared range on a boundary region with respect to the visible light wavelength range.

4. An image sensor comprising:
   a filter used for an extraction of a specific color component of an incident light:
   a light receiving element which observes the incident light via the filter:
   a compensating filter having a transmission restraining characteristic in a visible light wavelength range and a transmission characteristic in a wavelength range on a longer wavelength out of the visible light wavelength range; and
   a compensating light receiving element which observes the incident light via the compensating filter for compensating an observation result by the light receiving element wherein the filter comprises:

a yellow filter used for an extraction of a yellow component:

a magenta filter used for an extraction of a magenta component; and a cyan filter used for an extraction of a cyan component the light receiving element comprises:

a yellow light receiving element which observes the incident light via the yellow filter:

a magenta light receiving element which observes the incident light via the magenta filter; and a cyan light receiving element which observes the incident light via the cyan filter the compensating filter is formed by optically superimposing a cyan component and a red component, and the image sensor further comprises a resin layer which is disposed on at least one of a light incident side and a light output side of the filter and the compensating filter, and which restrains a transmittance in an infrared range on a boundary region with respect to the visible light wavelength range.

5. An image sensor comprising:

a filter used for an extraction of a specific color component of an incident light:

a light receiving element which observes the incident light via the filter:

a compensating filter having a transmission restraining characteristic in a visible light wavelength range and a transmission characteristic in a wavelength range on a longer wavelength out of the visible light wavelength range; and a compensating light receiving element which observes the incident light via the compensating filter for compensating an observation result by the light receiving element wherein the filter comprises:

a yellow filter used for an extraction of a yellow component:

a magenta filter used for an extraction of a magenta component; and a cyan filter used for an extraction of a cyan component the light receiving element comprises:

a yellow light receiving element which observes the incident light via the yellow filter:

a magenta light receiving element which observes the incident light via the magenta filter; and cyan light receiving element which observes the incident light via the cyan filter the compensating filter is formed by optically superimposing a cyan component and a red component, and a coloring material which restrains a transmittance in an infrared range on a boundary region with respect to the visible light wavelength range is added to the yellow filter and the magenta filter.

* * * * *